(12) United States Patent
Yamazaki et al.

(10) Patent No.: US 7,902,041 B2
(45) Date of Patent: Mar. 8, 2011

(54) METHOD FOR MANUFACTURING SEMICONDUCTOR DEVICE

(75) Inventors: Shunpei Yamazaki, Setagaya (JP); Hideto Ohnuma, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/546,719

(22) Filed: Aug. 25, 2009

(65) Prior Publication Data

US 2009/0309183 A1    Dec. 17, 2009

Related U.S. Application Data

(63) Continuation of application No. 12/078,214, filed on Mar. 28, 2008, now Pat. No. 7,601,601.

(30) Foreign Application Priority Data

May 11, 2007   (JP) ................................ 2007-127270

(51) Int. Cl.
*H01L 21/00* (2006.01)
*H01L 21/84* (2006.01)
*H01L 21/30* (2006.01)
*H01L 21/46* (2006.01)
*H01L 21/04* (2006.01)

(52) U.S. Cl. .......... 438/455; 438/458; 438/510; 438/149
(58) Field of Classification Search .................. 438/311, 438/455, 458, 459, 462, 465, 510, 479, 149
See application file for complete search history.

(56) References Cited

U.S. PATENT DOCUMENTS

| | | | | |
|---|---|---|---|---|
| 5,347,154 A | * | 9/1994 | Takahashi et al. | ............ 257/347 |
| 5,374,581 A | | 12/1994 | Ichikawa et al. | |
| 5,670,411 A | | 9/1997 | Yonehara et al. | |
| 5,695,557 A | * | 12/1997 | Yamagata et al. | .............. 117/97 |
| 6,093,623 A | | 7/2000 | Forbes | |
| 6,107,213 A | * | 8/2000 | Tayanaka | ....................... 438/762 |

(Continued)

FOREIGN PATENT DOCUMENTS

CN             1200560           12/1998

(Continued)

OTHER PUBLICATIONS

Chinese Office Action (Application No. 200810090719.3) dated Sep. 1, 2010.

*Primary Examiner* — Chuong A. Luu
(74) *Attorney, Agent, or Firm* — Eric J. Robinson; Robinson Intellectual Property Law Office, P.C.

(57) ABSTRACT

An object is to provide a method for manufacturing, with high yield, a semiconductor device having a crystalline semiconductor layer even if a substrate with low upper temperature limit. A groove is formed in a part of a semiconductor substrate to form a semiconductor substrate that has a projecting portion, and a bonding layer is formed to cover the projecting portion. In addition, before the bonding layer is formed, a portion of the semiconductor substrate to be the projecting portion is irradiated with accelerated ions to form a brittle layer. After the bonding layer and the supporting substrate are bonded together, heat treatment for separation of the semiconductor substrate is performed to provide a semiconductor layer over the supporting substrate. The semiconductor layer is selectively etched, and a semiconductor element is formed and a semiconductor device is manufactured.

20 Claims, 29 Drawing Sheets

U.S. PATENT DOCUMENTS

| | | | |
|---|---|---|---|
| 6,121,117 A | 9/2000 | Sato et al. | |
| 6,191,007 B1 * | 2/2001 | Matsui et al. | 438/459 |
| 6,335,231 B1 | 1/2002 | Yamazaki et al. | |
| 6,372,609 B1 | 4/2002 | Aga et al. | |
| 6,375,738 B1 * | 4/2002 | Sato | 117/89 |
| 6,380,019 B1 | 4/2002 | Yu et al. | |
| 6,380,046 B1 | 4/2002 | Yamazaki | |
| 6,534,380 B1 | 3/2003 | Yamauchi et al. | |
| 6,566,158 B2 | 5/2003 | Eriksen et al. | |
| 6,818,529 B2 | 11/2004 | Bachrach et al. | |
| 7,148,124 B1 | 12/2006 | Usenko | |
| RE39,484 E | 2/2007 | Bruel | |
| 7,199,024 B2 | 4/2007 | Yamazaki | |
| 7,410,882 B2 | 8/2008 | Wong et al. | |
| 7,682,931 B2 | 3/2010 | Yamazaki et al. | |
| 2002/0109144 A1 | 8/2002 | Yamazaki | |
| 2003/0190794 A1 | 10/2003 | Ohmi et al. | |
| 2005/0042798 A1 | 2/2005 | Nagao et al. | |
| 2005/0048736 A1 | 3/2005 | Kerdiles et al. | |
| 2007/0134891 A1 | 6/2007 | Adetutu et al. | |
| 2007/0173000 A1 | 7/2007 | Yamazaki | |
| 2007/0281440 A1 | 12/2007 | Cites et al. | |
| 2008/0246109 A1 | 10/2008 | Ohnuma et al. | |
| 2010/0081252 A1 * | 4/2010 | Makino | 438/458 |

FOREIGN PATENT DOCUMENTS

| | | |
|---|---|---|
| EP | 1 045 448 | 10/2000 |
| JP | 11-045862 | 2/1999 |
| JP | 11-163363 | 6/1999 |
| JP | 2000-124092 | 4/2000 |
| JP | 2005-252244 | 9/2005 |
| WO | WO 00/24059 | 4/2000 |

* cited by examiner 109a  100    104

| acceleration voltage | the ratio of the amount of H (X : Y) | the ratio of the number of H⁺ ions (X : Y/3) |
|---|---|---|
| 80 keV | 1 : 44.1 | 1 : 14.7 |
| 60 keV | 1 : 42.5 | 1 : 14.2 |
| 40 keV | 1 : 43.5 | 1 : 14.5 |

METHOD FOR MANUFACTURING SEMICONDUCTOR DEVICE

This application is a continuation of application Ser. No. 12/078,214, filed on Mar. 28, 2008, now U.S. Pat. No. 7,601,601.

BACKGROUND OF THE INVENTION

1. Field of the Invention

The present invention relates to a method for manufacturing a semiconductor device using a substrate that has an SOI structure.

2. Description of the Related Art

Instead of silicon wafers that are manufactured by thinly cutting an ingot of a single-crystal semiconductor, semiconductor substrates called silicon-on-insulator (SOI) substrates have been developed, which have a thin single-crystal semiconductor layer over an insulating layer. When transistors that are to be included in an integrated circuit are formed using an SOI substrate, parasitic capacitance between drains of the transistors and the substrate can be reduced, which is considered to be effective in improving operation speed and in reducing the amount of power consumption. Therefore, SOI substrates are expected to be applied to high-performance semiconductor devices such as microprocessors.

As a method for manufacturing SOI substrates, a hydrogen ion implantation separation method is known (for example, see Reference 1: Japanese Published Patent Application No. 2000-124092). The hydrogen ion implantation separation method is a method in which hydrogen ions are implanted into a silicon wafer to form a microbubble layer at a predetermined depth from the surface, the surface into which hydrogen ions are implanted is superposed on another silicon wafer, heat treatment is performed to cause separation using the microbubble layer as a cleavage plane, and a thin silicon layer (SOI layer) is bonded to the other silicon wafer. In addition to the heat treatment for separation of an SOI layer, it is necessary to perform heat treatment in an oxidizing atmosphere to form an oxide layer on the SOI layer, remove the oxide layer, perform heat treatment at 1000° C. to 1300° C. in a reducing atmosphere to increase bonding strength between the bonding surfaces, and recover a damaged layer on the surface of the SOI layer.

On the other hand, a semiconductor device, in which a single-crystal silicon layer is provided on an insulating substrate such as a high heat-resistant glass substrate, is disclosed (see Reference 2: Japanese Published Patent Application No. H11-163363). This semiconductor device has a structure in which the entire surface of a crystallized glass substrate with a strain point of 750° C. or higher is protected by an insulating silicon layer and a single-crystal silicon layer obtained by a hydrogen ion implantation separation method is fixed onto the insulating silicon layer.

SUMMARY OF THE INVENTION

A hydrogen ion implantation separation method requires heat treatment at a high temperature of 1000° C. or higher in order to strengthen bonding strength between an SOI layer and substrate, and to recover a damaged layer on the surface of the SOI layer. Therefore, in the case where an SOI substrate is formed by bonding of single-crystal silicon to a glass substrate that has an upper temperature limit of about 700° C., which is used for a liquid crystal panel or the like in order to lower the substrate cost, there arises a problem in that a glass substrate shrinks when heat treatment at such a high temperature is performed. The shrinkage of a glass substrate results in a decrease of bonding strength between a single-crystal silicon layer and the glass substrate, and a decrease of yield.

In view of such a problem, it is an object of the present invention to provide a method for manufacturing, with high yield, a semiconductor device having a crystalline semiconductor layer that can be used in practical applications even if a substrate with low upper temperature limit, such as a glass substrate, is used.

A groove is formed in a part of a semiconductor substrate, which is the base of a semiconductor layer, to form a semiconductor substrate that has a projecting portion, and a bonding layer is formed to cover the projecting portion. In addition, before the bonding layer is formed, at least a portion of the semiconductor substrate to be the projecting portion is irradiated with accelerated ions to make a part of the semiconductor substrate porous and to form a brittle layer. After the surface of the bonding layer and the surface of a supporting substrate are cleaned, the bonding layer and the supporting substrate are bonded together, and heat treatment for separation of the semiconductor substrate is performed to provide a semiconductor layer over the supporting substrate. The semiconductor layer is selectively etched, and a semiconductor element such as a field-effect transistor, a diode, a capacitor, or a nonvolatile memory element is formed and a semiconductor device is manufactured.

Before heat treatment for separation of a semiconductor substrate, a groove is formed in a part of the semiconductor substrate to form an isolated projecting portion. After that, the projecting portion is bonded to a supporting substrate, and the heat treatment for separation of the semiconductor substrate is performed. Because the supporting substrate shrinks due to the heat treatment for separation of the semiconductor substrate, the position of an SOI layer that is bonded to the supporting substrate also changes and distortion stress is generated. However, because the projecting portion is isolated by the groove, the projecting portion is not continuously bonded to the supporting substrate and is isolated. The generation of distortion stress on a semiconductor layer due to the shrinkage of the supporting substrate can be suppressed, and film separation and a decrease of bonding strength between the bonding surfaces can be reduced. In addition, because the shrinkage of the supporting substrate does not tend to occur easily in a later heating step, the misalignment of photomasks in a plurality of photolithography steps can be suppressed.

In forming a brittle region by irradiation of the semiconductor substrate with accelerated ions to make a part of the semiconductor substrate porous, there is a region of the semiconductor substrate which does not properly contain the accelerated ions even after the irradiation. This region of the semiconductor substrate is removed to form a groove and a projecting portion, and a continuous brittle region is formed in the projecting portion. After that, the divided semiconductor substrate is bonded to a supporting substrate, and heat treatment for separation of the semiconductor substrate is performed. By the heat treatment for separation of the semiconductor substrate, the entire projecting portion of the semiconductor substrate can be separated at the continuous brittle region, and a semiconductor layer with a predetermined thickness can be provided over the supporting substrate.

The bonding layer refers to a layer which forms a smooth surface and has a hydrophilic surface. As a layer which can form such a surface, an insulating layer formed by a chemical reaction is preferable. For example, an oxide layer formed by a thermal or chemical reaction is suitable. The main reason is that a film formed by a chemical reaction can ensure surface smoothness. A typical example of the bonding layer is a silicon oxide layer formed using an organic silane gas as a source material. Examples of the organic silane gas that can be used include silicon-containing compounds, such as tetraethoxysilane (TEOS) (chemical formula: $Si(OC_2H_5)_4$), tetramethylsilane (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

In addition, a blocking layer which prevents impurity diffusion is formed over a supporting substrate at a temperature equal to or lower than the strain point of the supporting substrate. After that, a semiconductor layer may be provided over the supporting substrate by bonding of the blocking layer of the supporting substrate and a bonding layer of the semiconductor substrate to each other and by performance of heat treatment for separation of the semiconductor substrate.

Before or after the groove is formed in the part of the semiconductor substrate, a blocking layer is formed on the surface of the semiconductor substrate and the bonding layer is formed on the blocking layer. After that, a semiconductor layer may be provided over a supporting substrate by bonding of the supporting substrate and the bonding layer of the semiconductor substrate to each other and by performance of heat treatment for separation of the semiconductor substrate.

As the blocking layer which is formed over the supporting substrate or the semiconductor substrate to prevent impurity element diffusion, a silicon nitride layer, a silicon nitride oxide layer, an aluminum nitride layer, or an aluminum nitride oxide layer can be provided. Furthermore, a silicon oxynitride layer may be provided in combination as an insulating layer which acts to relieve stress. Note that the silicon oxynitride film here means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at %, 25 at. % to 35 at. %, and 0.1 at. % to 10 at. %, respectively. Further, the silicon nitride oxide film means a film that contains more nitrogen than oxygen and, in the case where measurements are performed using RBS and HFS, includes oxygen, nitrogen, silicon, and hydrogen at concentrations ranging from 5 at % to 30 at. %, 20 at. % to 50 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Furthermore, before or after the groove is formed in the part of the semiconductor substrate, it is preferable that the semiconductor substrate be subjected to heat treatment in an oxidizing atmosphere. In particular, it is preferable that heat treatment be performed in a halogen-containing oxidizing atmosphere. For example, an oxide layer is formed on the semiconductor substrate by heat treatment with a slight amount of hydrochloric acid being added to oxygen. This allows dangling bonds at the interface between the semiconductor substrate and the oxide layer to be terminated by hydrogen. Accordingly, the interface can be deactivated and electrical characteristics can be stabilized. In addition Chlorine reacts with a metal which is contained in the semiconductor substrate and acts to remove (getter) the metal.

After a groove is formed in a part of a semiconductor substrate to form a semiconductor substrate that has a projecting portion, the protecting portion can be bonded to a supporting substrate; the semiconductor substrate can be separated from a brittle region by heat treatment; and an SOI layer can be provided over the supporting substrate. Because the projecting portion on the semiconductor substrate is isolated, the separation of the SOI layer that accompanies the shrinkage of the supporting substrate due to heating can be prevented.

In addition, because a continuous brittle layer is formed in the projecting portion of the semiconductor substrate, an SOI layer with a predetermined thickness can be provided over the supporting substrate.

Therefore, by use of the SOI layer, a semiconductor device can be manufactured with high yield.

BRIEF DESCRIPTION OF THE DRAWINGS

FIG. 30 is a list of ratios of fitting parameters (hydrogen atom ratios and hydrogen ion species ratios).

DETAILED DESCRIPTION OF THE INVENTION

Figure 1A:
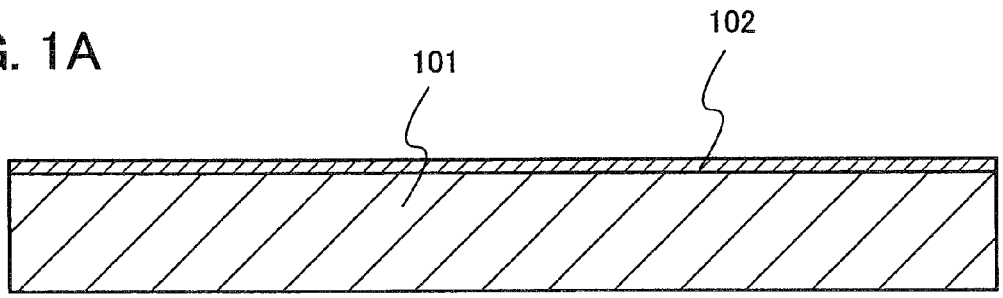
FIGS. 1A to 1D are cross-sectional views showing manufacturing steps of a semiconductor device of the present invention.

Embodiment modes of the present invention will be hereinafter described with reference to the drawings. However, the present invention is not limited to the following description, and it is easily understood by those skilled in the art that the mode and detail of the present invention can be variously changed without departing from the spirit and scope thereof. Therefore, the present invention should not be interpreted as being limited to the following description of the embodiment modes. In the structures of the present invention given below, a reference numeral denoting the same component is commonly used among different drawings.

Note that, although the case where a single-crystal semiconductor layer is provided over a substrate having an insulating surface or an insulating substrate is described below, a polycrystalline semiconductor layer can also be fixed over a substrate having an insulating surface or an insulating substrate if the kind of semiconductor substrate that is the base of a single-crystal semiconductor layer is changed.

Embodiment Mode 1

Figure 5:
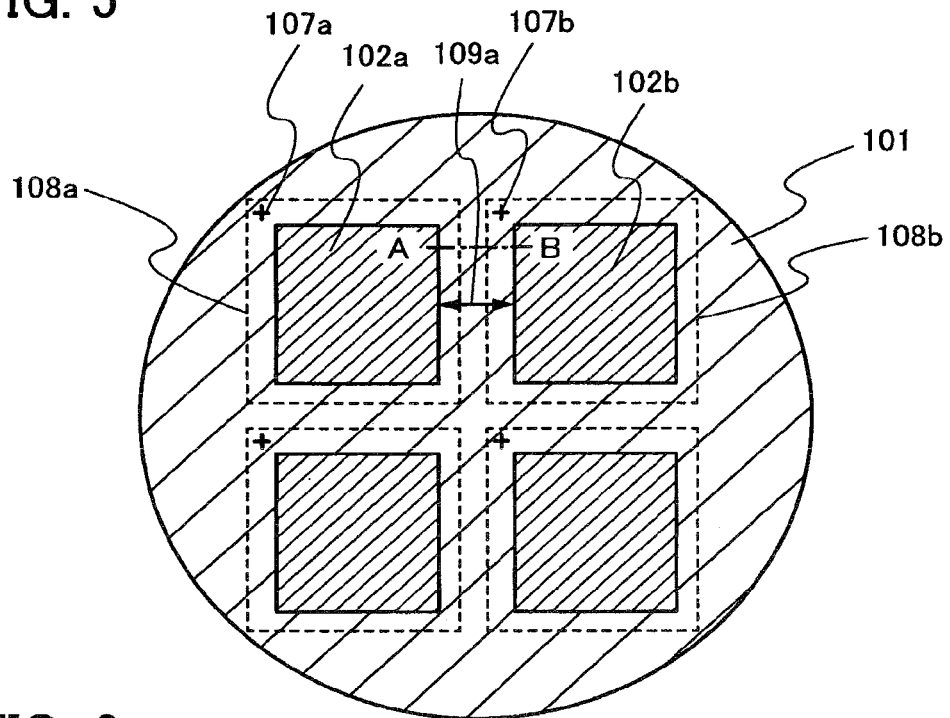
FIG. 5 is a top view showing a manufacturing step of a semiconductor device of the present invention.
Figure 6:
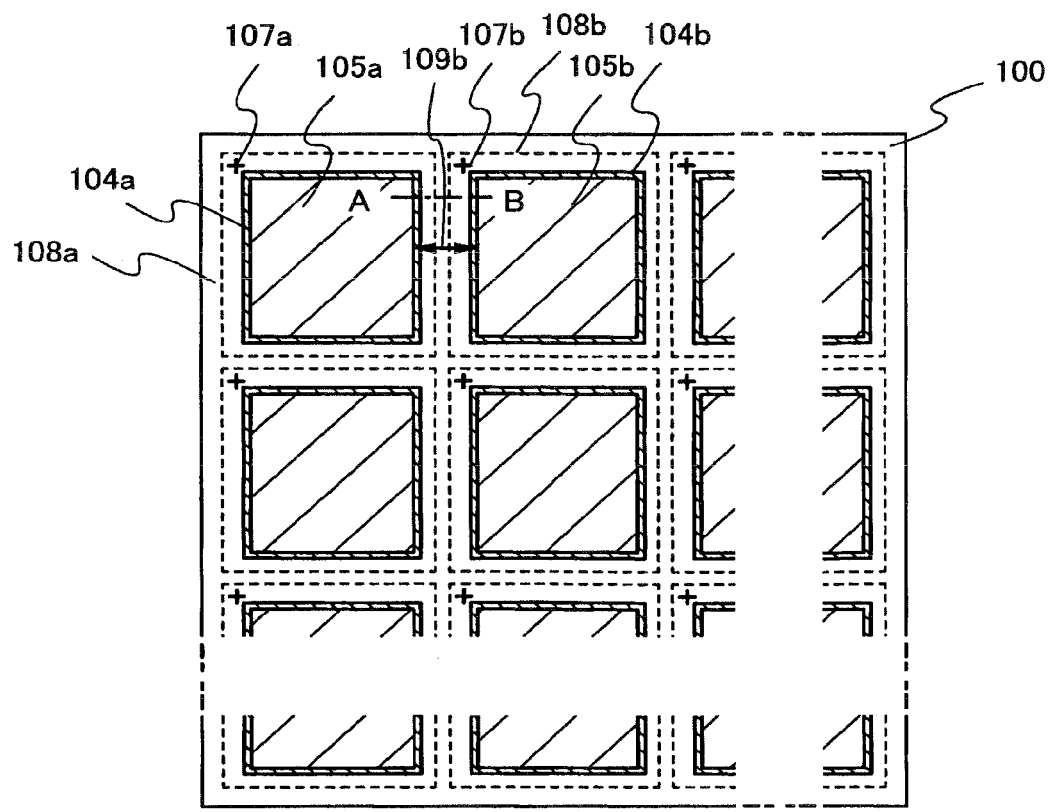
FIG. 6 is a top view showing a manufacturing step of a semiconductor device of the present invention.
Figure 7:
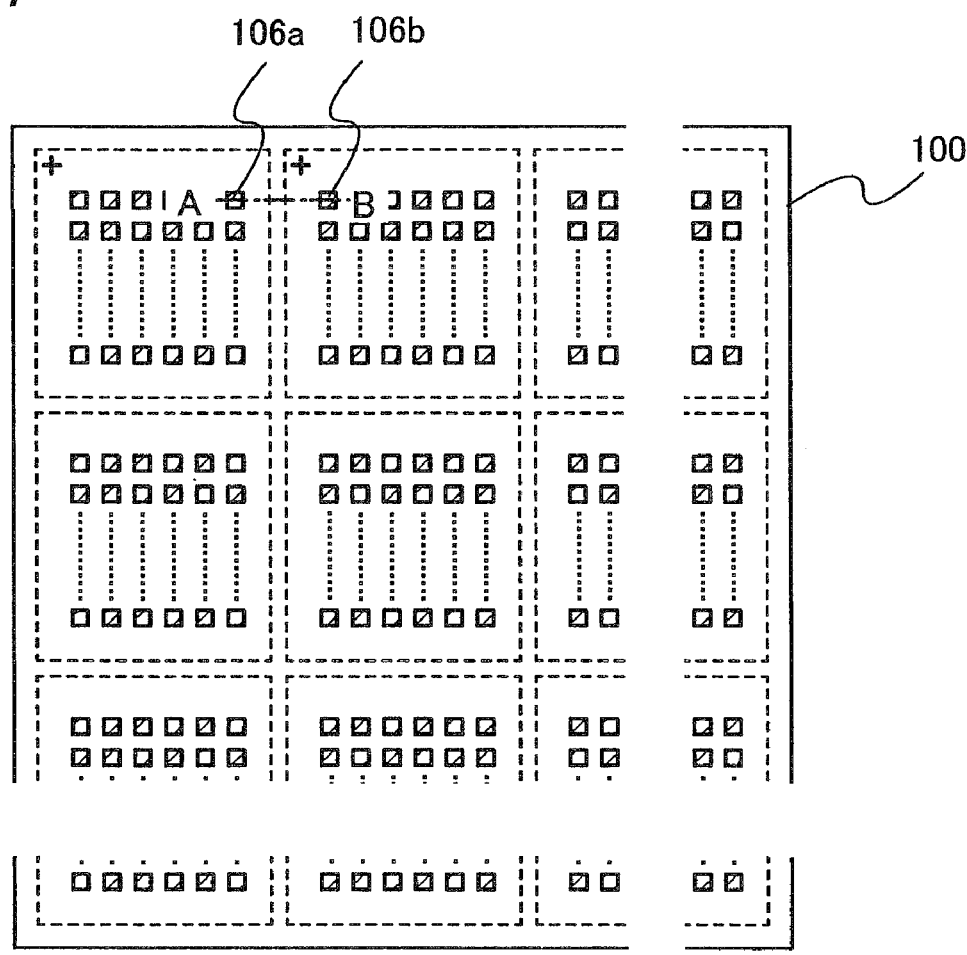
FIG. 7 is a top view showing a manufacturing step of a semiconductor device of the present invention.

In this embodiment mode, a method for manufacturing a semiconductor device with high yield, in consideration of the shrinkage of a supporting substrate in bonding a semiconductor substrate to the supporting substrate and performing heat treatment to separate a part of the semiconductor substrate, is described with reference to FIGS. 1A to 7. FIG. 1A to 4B are cross-sectional views of FIGS. 5 to 7 along A-B. FIG. 5 shows a top view of a semiconductor substrate, and FIGS. 6 and 7 show top views of a supporting substrate.

In FIG. 1A, as a semiconductor substrate 101, a crystalline semiconductor substrate or a single-crystal semiconductor substrate can be used. Examples of a crystalline semiconductor substrate or a single-crystal semiconductor substrate include a silicon substrate, a germanium substrate, and the like, and alternatively, a substrate of a compound semiconductor such as silicon germanium, gallium arsenide, or indium phosphide can be used. Commercial silicon substrates typically have a size of 5 inches (125 mm) in diameter, 6 inches (150 mm) in diameter, 8 inches (200 mm) in diameter, and 12 inches (300 mm) in diameter and most of them have a circular shape. The thickness can be appropriately selected up to about 1.5 mm. Here, as the semiconductor substrate 101, a p-type or n-type single-crystal silicon substrate (silicon wafer) is used.

A blocking layer 102 is formed on a surface of the semiconductor substrate 101. For the blocking layer 102, a single-layer structure or a stacked-layer structure of a plurality of films selected from a silicon nitride layer, a silicon nitride oxide layer, an aluminum nitride layer, and an aluminum nitride oxide layer is employed. A silicon nitride layer, a silicon nitride oxide layer, an aluminum nitride layer, or an aluminum nitride oxide layer is formed by a vapor-phase growth method at a thickness of 50 nm to 200 nm. For example, a silicon nitride layer is formed by a plasma CVD method using $SiH_4$ and $NH_3$ as a source gas. A silicon nitride oxide layer is formed by a plasma CVD method using $SiH_4$, $N_2O$, and $NH_3$. An aluminum nitride layer is formed by a reactive sputtering method using an aluminum target and using nitrogen as a reactive gas. Alternatively, an aluminum nitride layer is formed by a thermal CVD method using aluminum chloride or aluminum bromide and ammonia as a source gas. An aluminum nitride oxide layer is formed by a reactive sputtering method using an aluminum target and using nitrogen and oxygen as a reactive gas. Alternatively, an aluminum nitride oxide layer is formed by a thermal CVD method using aluminum chloride or aluminum bromide, ammonia, and dinitrogen monoxide as a source gas.

The blocking layer 102 has an effect on prevention of impurity diffusion into an SOI layer which is to be formed from the semiconductor substrate 101. In addition, in forming a brittle layer (specifically referring to a brittle layer irradiated with accelerated ions and hereinafter referred to as a brittle region), the blocking layer 102 has an effect in preventing the surface of the semiconductor substrate 101 irradiated with ions from being damaged by ion irradiation and from losing its planarity.

Figure 1B:
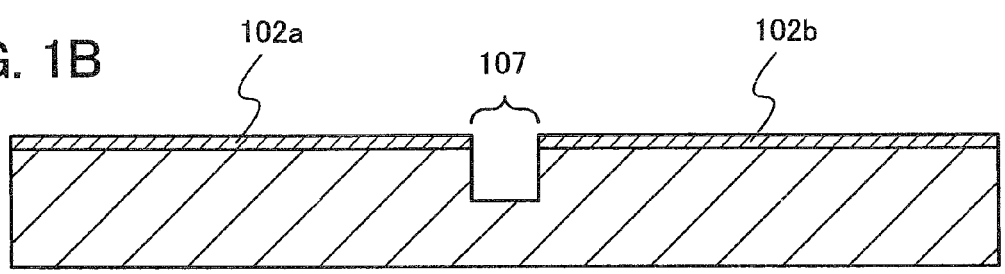

In FIG. 1B, a part of the semiconductor substrate 101 is removed to form a groove 107. As a result, isolated projecting portions are formed on the semiconductor substrate 101. In addition, the blocking layer 102 is divided.

Here, FIG. 5 shows a schematic top view of the semiconductor substrate 101 after the groove is formed. Note that a cross-sectional view of FIG. 5 along line A-B corresponds to FIG. 1B.

The semiconductor substrate 101 is selectively etched, and blocking layers 102a and 102b remain in portions corresponding to the projecting portions of FIG. 1B. Each of the projecting portions formed on the semiconductor substrate 101, when seen from above, roughly corresponds to a region to be exposed to light at a time by a light exposure apparatus.

In the field of semiconductor device manufacturing and the like, photolithography is often employed in forming a fine pattern or the like. In photolithography, by use of a light exposure apparatus typified by a stepper, a resist layer coating a substrate is exposed to light and developed into a desired pattern shape, and then, a desired pattern is formed over the substrate by using the pattern shape. The area of a region exposed to light at a time by a light exposure apparatus depends on the apparatus, but when an existing stepper is used, the area of the region exposed to light at a time is about 25 mm×25 mm, 100 mm×100 mm, 113 mm×113 mm, 132 mm×132 mm, or 144 mm×144 mm. It is difficult to expose at once a large-sized substrate that is longer than one meter on each side. Therefore, if a region to be exposed to light at a time by a light exposure apparatus is set in advance to correspond to an SOI layer, a desired circuit pattern can be formed efficiently.

In FIG. 5, regions 108a and 108b each to be exposed to light at a time by a light exposure apparatus are indicated by broken lines. The semiconductor substrate 101 is selectively etched so that the size of a region to be bonded as an SOI layer corresponds to the size of a region to be exposed to light at a time by a light exposure apparatus.

In the regions 108a and 108b each to be exposed to light at a time by a light exposure apparatus, alignment markers 107a and 107b also remain. Over portions to be the alignment markers 107a and 107b, resist masks are also formed when resist masks are formed over portions of the semiconductor substrate to be SOI layers. In the case of the semiconductor substrate 101 shown in FIG. 5, the blocking layers also remain over the alignment markers. Note that the alignment markers 107a and 107b are omitted in the cross-sectional view of FIG. 1B.

As a method for removing a part of the semiconductor substrate 101 to form a groove, a portion other than a portion to be removed is covered with a resist mask, and then, a part of the semiconductor substrate 101 is etched by a dry etching method or a wet etching method. Alternatively, a groove can be formed by a blade of a dicing apparatus, a scriber, a laser beam, or the like. The depth of a groove is appropriately selected in consideration of the thickness of an SOI layer to be transferred to a supporting substrate later. Note that the thickness of an SOI layer can be set depending on the position of a region which contains an element of accelerated ions. In this embodiment mode, it is preferable that the depth of the groove in the semiconductor substrate 101 be larger than that of a brittle region (that is, the position where the brittle layer is formed). By setting the depth of a groove to be larger than that of a brittle region in processing the groove in the semiconductor substrate 101, only an isolated projecting portion of the semiconductor substrate 101 can be easily bonded to a supporting substrate in transferring an SOI layer to the supporting substrate later.

Figure 1C:
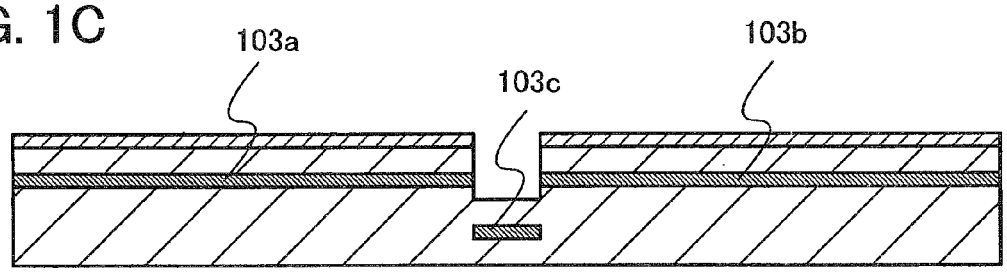

In FIG. 1C, the semiconductor substrate 101 is irradiated with accelerated hydrogen ions or halogen ions to form brittle regions 103a to 103c. The brittle regions 103a to 103c refer to regions which contain an element of ions through irradiation with the accelerated ions. For example, the brittle regions 103a to 103c refer to brittle regions which contain hydrogen or a halogen and are also referred to as brittle layers.

The brittle regions 103a to 103c are formed by irradiation of the surface of the semiconductor substrate 101 with ions that are accelerated by an electric field so that an element of the ions is contained at a predetermined depth. Examples of such an ion irradiation method include an ion doping method, an ion implantation method, and the like. The depth of the brittle regions 103a to 103c formed in the semiconductor substrate 101 is controlled by ion accelerating energy and ion incident angle. The brittle regions 103a to 103c are formed in regions at a depth close to the average penetration depth of the ions from the surface of the semiconductor substrate 101. For example, the thickness of a semiconductor layer is 5 nm to 500 nm, preferably, 10 nm to 200 nm, and the accelerating voltage at the time of irradiating a semiconductor substrate with ions is determined in consideration of such a thickness.

Ion irradiation is preferably performed using an ion doping apparatus. That is, a doping method is used by which an object is irradiated with a plurality of ion species that is generated from a plasma of a source gas and accelerated by an electric field without any mass separation being performed, so that the object contains an element of the ionized gas. In this mode, doping with hydrogen ions or halogen ions is preferable. Ion doping may be performed with an accelerating voltage of 10 kV to 100 kV, preferably, 30 kV to 80 kV, at a dose of $1\times10^{16}/\text{cm}^2$ to $4\times10^{16}/\text{cm}^2$, and with a beam current density of 2 $\mu\text{A}/\text{cm}^2$ or more, preferably, 5 $\mu\text{A}/\text{cm}^2$ or more, more preferably, 10 $\mu\text{A}/\text{cm}^2$ or more. Accordingly, defects caused in a semiconductor layer can be reduced.

In the case of irradiation with hydrogen ions, the hydrogen ions preferably include $H^+$, $H_2^+$, and $H_3^+$ ions with a high proportion of $H_3^+$ ions. With a high proportion of $H_3^+$ ions, the introduction efficiency can be increased and doping time can be shortened compared with the case of ion irradiation without a high proportion of $H_3^+$ ions. Accordingly, the brittle regions 103a to 103c formed in the semiconductor substrate 101 can be made to contain hydrogen at $1\times10^{20}/\text{cm}^3$ (preferably, $5\times10^{20}/\text{cm}^3$). When a region which contains hydrogen at high concentration is locally formed in the semiconductor substrate 101, a crystal structure is disordered and microvoids are formed, whereby the brittle regions 103a to 103c having a porous structure can be formed. In this case, by heat treatment at relatively low temperature, a change occurs in the volume of the microvoids formed in the brittle regions 103a to 103c, which enables cleavage (separation) to occur along the brittle regions and enables thin semiconductor layers to be formed.

Note that the term "ion doping" in this specification refers to a method by which an object is irradiated with an ionized gas that is generated from a source gas and accelerated by an electric field without any mass separation being performed. With the use of an ion doping apparatus, ion doping of even a large-sized substrate can be performed with high efficiency and at high dose.

The accelerating voltage for ion doping may be set to be 20 kV to 100 kV, preferably, 20 kV to 70 kV, and the dose may be set to be $1\times10^{16}$ ions/$\text{cm}^2$ to $4\times10^{16}$ ions/$\text{cm}^2$, preferably, $1\times10^{16}$ ions/$\text{cm}^2$ to $2.5\times10^{16}$ ions/$\text{cm}^2$. In this embodiment mode, ion doping is performed with an accelerating voltage of 80 kV at a dose of $2\times10^{16}$ ions/$\text{cm}^2$.

The brittle regions 103a to 103c can be similarly formed even if the semiconductor substrate 101 is irradiated with accelerated ions with mass separation being performed. In this case, selective irradiation with ions having large mass (for example, $H_3^+$ ions) is also preferable because similar effects to those described above can be achieved.

As a gas from which ions are generated, deuterium or an inert gas such as helium as well as hydrogen can be selected. By use of helium as a source gas and an ion doping apparatus which does not have a mass separation function, an ion beam with a high proportion of $He^+$ ions can be obtained. By irradiation of the semiconductor substrate 101 with such ions, microvoids can be formed and brittle regions 103a to 103c similar to those described above can be formed in the semiconductor substrate 101.

Note that, here, because an element of accelerated ions is contained in a region at a certain depth from the surface of the semiconductor substrate 101, a brittle region 103c is also formed in a region at a certain depth from the surface of the groove 107 as well as in the regions of the projecting portions on the semiconductor substrate.

Figure 1D:
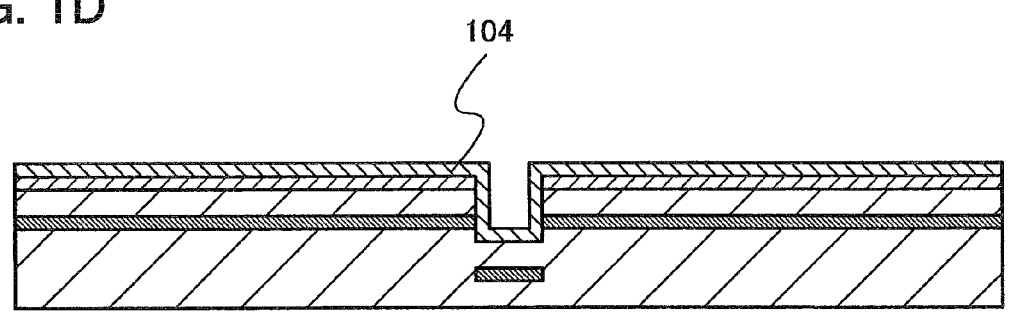

FIG. 1D shows the stage of forming a bonding layer 104 (a layer formed at a bonding interface). The bonding layer 104 is a layer that forms a smooth surface and has a hydrophilic surface. As a layer which can form such a surface, an insulating layer formed by a chemical reaction is preferable. For example, an oxide layer formed by a thermal or chemical reaction is suitable. The main reason is that a layer formed by a chemical reaction can ensure surface smoothness. The bonding layer 104 which forms a smooth surface and has a hydrophilic surface is provided at a thickness of 0.2 nm to 500 nm. With this thickness, it is possible to smooth surface roughness of a surface on which a film is to be formed and also to ensure smoothness of a growing surface of the film.

A preferred example of the bonding layer 104 is a silicon oxide layer deposited by a chemical vapor deposition method. In this case, a silicon oxide layer formed by a chemical vapor deposition method using an organic silane gas is preferable. Examples of the organic silane gas that can be used include silicon-containing compounds such as tetraethoxysilane (TEOS) (chemical formula: $Si(OC_2H_5)_4$), tetramethylsilane (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). Film formation by a chemical vapor deposition method is performed at a temperature, for example, 350° C. or lower, at which degassing of the brittle regions 103a to 103c that are formed in the semiconductor substrate does not occur. In addition, heat treatment for separation of a single-crystal semiconductor layer or a polycrystalline semiconductor layer from a single-crystal semiconductor substrate or a polycrystalline semiconductor substrate is performed at a temperature higher than the temperature at which the bonding layer 104 is formed.

Note that the bonding layer 104 may be formed on one or both of the supporting substrate 100 side or the semiconductor substrate 101 side.

Alternatively, the blocking layer 102 and the bonding layer 104 may be formed after the brittle regions 103a to 103c are formed and a part of the semiconductor substrate 101 is removed to form the groove 107 in the steps of FIGS. 1B and 1C. Through this process, the blocking layer 102 and the bonding layer 104 can be continuously formed without being exposed to the air, and the semiconductor substrate 101 can be prevented from being mixed with a foreign substance or from being contaminated by potassium, sodium, or the like. In addition, because the brittle region 103c is not formed in a part of the semiconductor substrate to be separated from the semiconductor substrate 101 in a later separation step, the semiconductor substrate 101 can be easily reused.

Figure 2A:
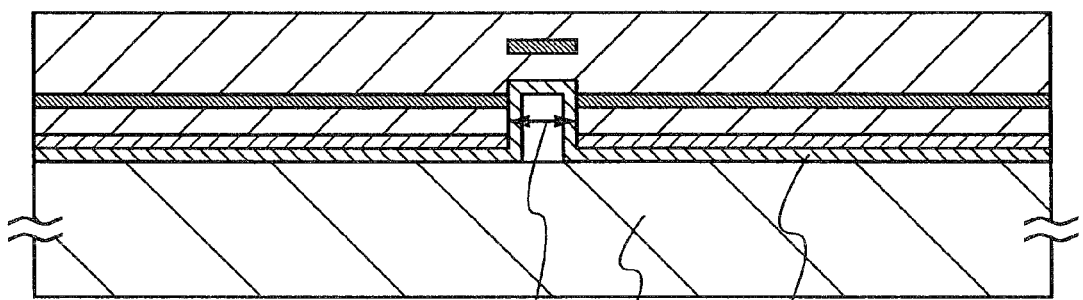
FIGS. 2A and 2B are cross-sectional views showing manufacturing steps of a semiconductor device of the present invention.

FIG. 2A shows the stage of bonding the supporting substrate 100 and the semiconductor substrate 101 together. A bond is formed by making the supporting substrate 100 and the surface of the semiconductor substrate 101 where the bonding layer 104 is formed face each other and be in contact with each other. A surface which is to form a bond is subjected to degreasing treatment and is sufficiently cleaned. Then, the supporting substrate 100 and the sealing layer 104 are located in contact with each other, whereby a bond is formed even at room temperature. This bonding is caused by an attracting force between the surfaces, and it is more preferable that the surface be subjected to treatment for attaching a plurality of hydrophilic groups. For example, it is preferable that the surface of the supporting substrate 100 be subjected to oxygen plasma treatment or ozone treatment and be made to be hydrophilic. When treatment for making the surface hydrophilic is applied, hydroxyl groups on the surface act to form a bond by hydrogen bonding. Furthermore, when heating is performed at room temperature or higher, bonding strength can be made to be higher than that of the bond formed by locating cleaned surfaces in contact with each other.

In order to form a favorable bond, as pretreatment on the surface of the bonding layer 104 and/or the surface to be in contact with the bonding layer 104, irradiation of the surface with an ion beam obtained from an inert gas such as argon and cleaning of the surface are effective. By irradiation with an ion beam, dangling bonds are exposed on the surface of the bonding layer 104 and/or the surface to be in contact with the bonding layer 104, and a very active surface is formed. If such activated surfaces are located in contact with each other, a bond can be formed even at low temperature. A method of forming a bond after surface activation is preferably performed in vacuum because the surface needs to be highly cleaned.

Such surface treatment enables bonding strength between different kinds of materials to be increased even at a temperature of 200° C. to 400° C.

The supporting substrate 100 refers to a substrate to be provided with an SOI layer and refers to an insulating substrate or a substrate having an insulating surface. Glass substrates (also referred to as "non-alkali glass substrates") that are used in the electronics industry, such as aluminosilicate glass substrates, aluminoborosilicate glass substrates, and barium borosilicate glass substrates can be used. In other words, glass substrates that have a thermal expansion coefficient of $25 \times 10^{-7}$/° C. to $50 \times 10^{-7}$/C (preferably, $30 \times 10^{-7}$/° C. to $40 \times 10^{-7}$/° C.) and a distortion point of 580° C. to 680° C. (preferably, 600° C. to 680° C.) can be used. Alternatively, quartz substrates, ceramic substrates, metal substrates with their surfaces covered with an insulating layer, and the like can be used.

Figure 2B:
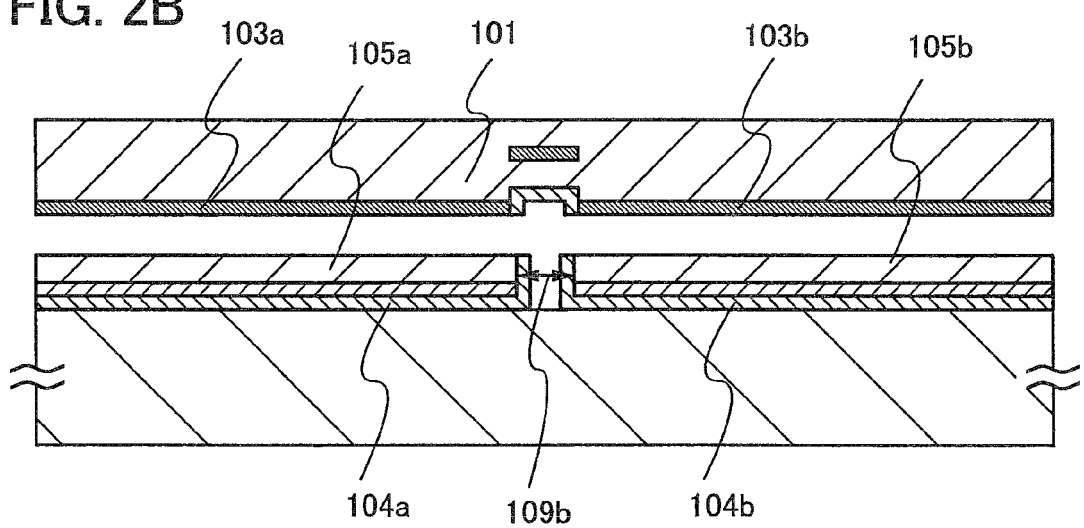

FIG. 2B shows the stage of separating SOI layers 105a and 105b from the semiconductor substrate 101. After the semiconductor substrate 101 and the supporting substrate 100 are superposed on each other and the bonding layer 104 is bonded to the semiconductor substrate 100, heat treatment is performed. The heat treatment allows the semiconductor substrate 101 to be separated while the SOI layers 105a and 105b are left remaining over the supporting substrate 100 and also allows bonding strength between the bonding surfaces to be increased. The heat treatment is preferably performed at a temperature equal to or higher than the temperature at which the bonding layer 104 is formed, preferably at equal to or higher than 400° C. to lower than 600° C. Through the heat treatment performed within this temperature range, a change occurs in the volume of the microvoids formed in the brittle regions 103a and 103b, which allows semiconductor layers to be separated along the brittle regions 103a to 103b. Because the bonding layer 104 is bonded to the supporting substrate 100, the SOI layers 105a and 105b having the same crystallinity as that of the semiconductor substrate 101 are bonded onto the supporting substrate 100.

Note that, in the case where a single-crystal semiconductor substrate is used as the semiconductor substrate 101, the SOI layers 105a and 105b are single-crystal semiconductor layers. In the case where a crystalline semiconductor substrate is used as the semiconductor substrate 101, the SOI layers 105a and 105b are crystalline semiconductor layers.

FIG. 6 is a schematic top view of the supporting substrate 100 to which the SOI layers are bonded. Note that a cross-sectional view of FIG. 6 along line A-B corresponds to FIG. 2B.

On the supporting substrate 100, the SOI layers 105a and 105b are regularly arranged with a region to be exposed to light at a time by a light exposure apparatus being as one unit. In addition, the alignment markers 107a and 107b that have the same crystallinity as the SOI layers are also formed.

In FIG. 6, a region to be exposed to light at a time by a light exposure apparatus is provided with a single alignment marker and a single SOI layer. Because the SOI layers are arranged in consideration of the region to be exposed to light at a time by a light exposure apparatus and each of the SOI layers corresponds to the region to be exposed to light at a time by a light exposure apparatus, light exposure and pattern formation can be performed efficiently.

By the heat treatment shown in FIG. 2B, the supporting substrate shrinks and the distance between the SOI layers 105a and 105b becomes shorter. In FIG. 2A, a distance 109a between the SOI layers at the time when the bonding layer 104 and the supporting substrate 100 are bonded together is about the same as the distance 109a between the SOI layers at the time when the groove is formed in the semiconductor substrate 101. However, it can be seen as shown in FIGS. 2B and 6 that the distance 109a is decreased to a distance 109b after the heat treatment.

After this, heat treatment is preferably performed in a state where the SOI layers 105a and 105b are fixed to the supporting substrate 100. One of the purposes of this heat treatment is to detach a slight amount of hydrogen or a halogen which is implanted in forming the brittle region 110 and remains in the SOI layers 105a and 105b from the SOI layers 105a and 105b. The temperature of the heat treatment can range from a temperature at which hydrogen or a halogen is released from the brittle region 110 to a temperature around the distortion point of the supporting substrate 100. For example, the heat treatment is performed at a temperature in the range of 400° C. to 730° C. As a heat treatment apparatus, an electrically-heated oven, a lamp annealing furnace, or the like can be used. The heat treatment may be performed with multilevel changes of temperature. Alternatively, a rapid thermal annealing (RTA) apparatus may be used. If the heat treatment is performed using an RTA apparatus, heating up to near a substrate distortion point or a slightly higher temperature is also possible.

In some cases, excessive hydrogen contained in the SOI layers 105a and 105b exhibits complex behaviors and acts to degrade the characteristics of a semiconductor element depending on heat history. For example, hydrogen contained between silicon lattices acts to deactivate an impurity element which is added for the purpose of valence control. This leads to variation of threshold voltages among transistors and an increase in resistance of a source or drain region. If hydrogen is contained in a silicon lattice, hydrogen behaves in some cases to change the coordination number of silicon and to generate a lattice defect. It is needless to say that hydrogen or a halogen acts to compensate dangling bonds in silicon, that is, to repair a defect; however, it is preferable that hydrogen or a halogen contained in the brittle region 110 be removed once from the SOI layers 105a and 105b.

If heat treatment as described above is performed, hydrogen bonds at the bonding surface between the supporting substrate 100 and the bonding layer 104a and 104b can be changed into stronger covalent bonds.

Next, it is preferable that the SOI layers 105a and 105b be irradiated with an energy beam to repair crystal defects. Because the SOI layers 105a and 105b are thermally and/or mechanically damaged and the crystallinity is degraded when bonded to the supporting substrate 100, this step is preferably performed to repair defects of the SOI layers 105a and 105b. As the energy beam, an energy beam that is selectively absorbed by the SOI layers 105a and 105b is preferable, and a laser beam is desired to be applied. This is in order to repair defects of the SOI layers 105a and 105b without heating the supporting substrate 100 excessively. As the laser beam, a gas laser typified by an excimer laser or a solid-state laser typified by a YAG laser can be used as a light source. The wavelength of the laser beam is preferably in the range of ultraviolet light to infrared light. A laser beam emitted from a light source is preferably converged into a rectangular or linear shape by an optical system, and treatment may be performed by scanning the SOI layers 105a and 105b with the laser beam.

Alternatively, flash lamp annealing which is performed using a halogen lamp, a xenon lamp, or the like may be employed for a similar purpose.

In this step, the SOI layers 105a and 105b are already dehydrogenated; therefore, crystal defects can be repaired without any void being generated in the SOI layers 105a and 105b. In addition, if treatment of irradiating the SOI layers 105a and 105b with an energy beam is performed in a nitrogen atmosphere, the surfaces of the SOI layers 105a and 105b can be planarized.

On the other hand, when the SOI layers 105a and 105b contain a small amount of hydrogen, the treatment of irradiating the SOI layers 105a and 105b with an energy beam may be performed after the supporting substrate 100 and the SOI layers 105a and 105b are bonded together. If heat treatment is performed after crystal defects of the SOI layers 105a and 105b are repaired, heat distortion of the SOI layers 105a and 105b and the supporting substrate 100 can be eliminated and bonding strength between bonding surfaces can be increased.

Through the above steps, an SOI substrate in which parts of a semiconductor layer are separated can be formed.

Figure 3A:
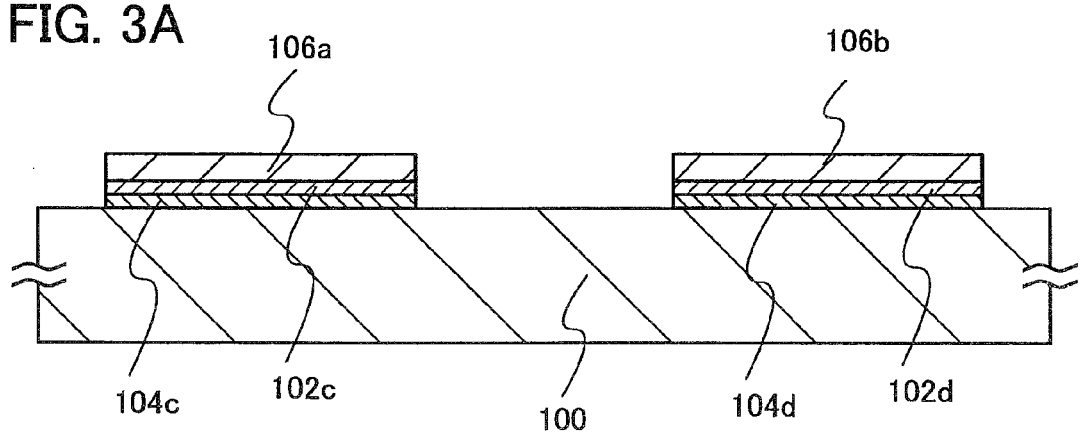
FIGS. 3A to 3C are cross-sectional views showing manufacturing steps of a semiconductor device of the present invention.

Next, a semiconductor device of this mode is described with reference to FIGS. 3A to 4B. The SOI layers 105a and 105b shown in FIG. 2B are selectively etched to form semiconductor layers 106a and 106b as shown in FIG. 3A. Here, resist masks are formed by a photolithography step to cover parts of the SOI layers 105a and 105b, and the SOI layers 105a and 105b are selectively etched to form the semiconductor layers 106a and 106b. Note that, as well as the SOI layers 105a and 105b, the blocking layers 102a and 102b and bonding layers 104a and 104b may be etched.

The semiconductor layers 106a and 106b are provided over the supporting substrate 100 with blocking layers 102c and 102d and bonding layers 104c and 104d being interposed therebetween. The blocking layers 102c and 102d may be provided on the supporting substrate 100 side. When the blocking layers 102c and 102d are provided, the SOI layers 105a and 105b can be prevented from being contaminated.

The thickness of the SOI layers 105a and 105b is set to be 5 nm to 500 nm, preferably, 10 nm to 200 nm, more preferably, 10 nm to 60 nm. The thickness of the SOI layers 105a and 105b can be appropriately set by control of the depth of the brittle regions 103a to 103c as shown in FIG. 1C. To the semiconductor layers 106a and 106b, a p-type impurity such as boron, aluminum, or gallium or an n-type impurity such as phosphorus or arsenic is preferably added to match a formation region of an n-channel field-effect transistor or a p-channel field-effect transistor. In other words, a p-type impurity is added to a formation region of an n-channel field-effect transistor or an n-type impurity is added to a formation region of a p-channel field-effect transistor, whereby a so-called well region is formed. The dose of impurity ions may be approximately $1 \times 10^{12}/\text{cm}^2$ to $1 \times 10^{14}/\text{cm}^2$. Furthermore, in the case of controlling the threshold voltage of the field-effect transistor, a p-type or n-type impurity may be added to the well region.

FIG. 7 shows a schematic top view of the supporting substrate 100 over which the semiconductor layers 106a and 106b are formed. Note that a cross-sectional view of FIG. 7 along A-B corresponds to FIG. 3A.

FIG. 7 shows an example in which position alignment is performed using the alignment marker 107a and a desired pattern is formed by selective etching of the SOI layer 105a. For example, the SOI layer 105a is exposed to light, to which a circuit pattern is transferred. At this time, position alignment or the like can be easily performed in photolithography if the alignment marker 107a is formed. Note that each pattern of the semiconductor layer 106a after the etching forms a channel portion of a transistor formed in a circuit portion, for example.

Figure 3B:
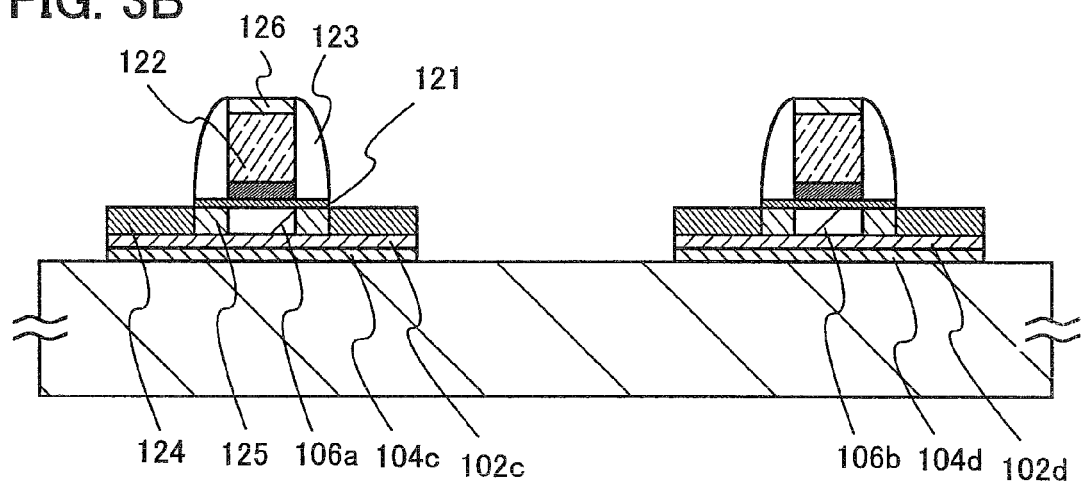

As shown in FIG. 3B, a gate insulating layer 121, a gate electrode 122, and a sidewall insulating layer 123 are formed, and a first impurity region 124 and a second impurity region 125 are formed. An insulating layer 126 is formed of a silicon nitride layer and is used as a hard mask when the gate electrode 122 is etched.

Figure 3C:
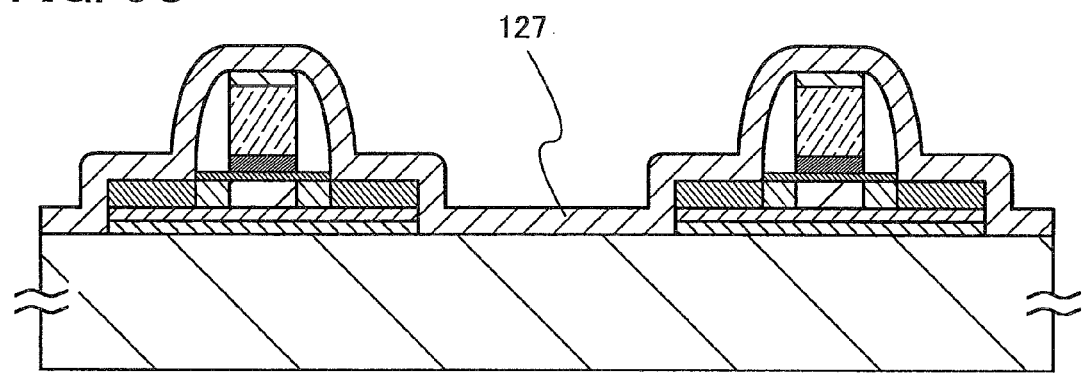

FIG. 3C shows the stage of forming a protective layer 127 after forming the gate electrode 122 and the like. As the protective layer 127, a silicon nitride layer or a silicon nitride oxide layer is preferably formed by a plasma CVD method at a substrate temperature of 350° C. or lower during film formation. In other words, the protective layer 127 is made to contain hydrogen. After the protective layer 127 is formed, hydrogen contained in the protective layer 127 is diffused into the semiconductor layers 106a and 106b by heat treatment at 350° C. to 450° C. (preferably, 400° C. to 420° C.). By supply of hydrogen, which compensates defects during an element formation step, to the semiconductor layers 106a and 106b which have been dehydrogenated in the previous step, such defects as to serve as trapping centers can be compensated effectively. In addition, the blocking layers 102c and 102d prevent impurity diffusion from the supporting substrate 100 side, whereas the protective layer 127 is effective in preventing impurity contamination from the upper layer side. In this mode, an upper layer side and a lower layer side of the semiconductor layers 106a and 106b having excellent crystallinity are covered with insulating layers which are highly effective in preventing highly mobile impurity ions of sodium or the like. Therefore, a great effect in stabilizing the characteristics of semiconductor elements manufactured using the semiconductor layers 106a and 106b is obtained.

Figure 4A:
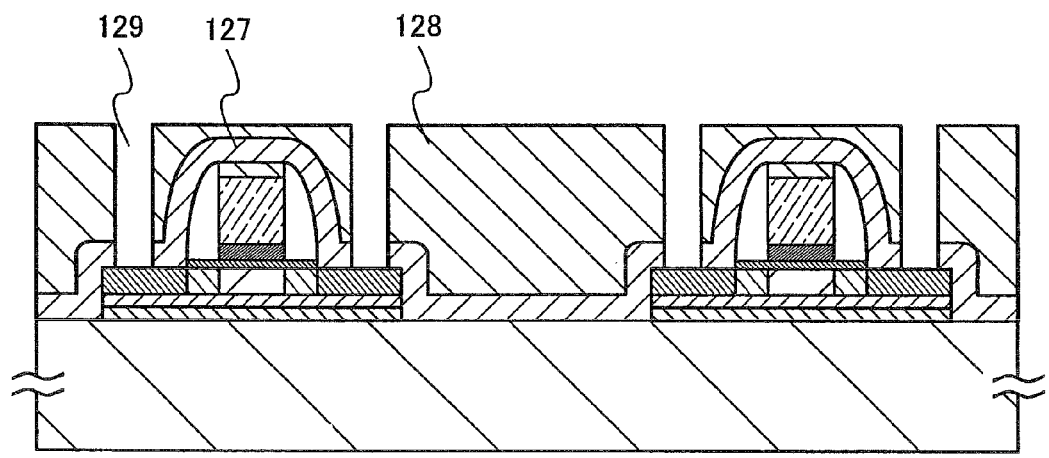
FIGS. 4A and 4B are cross-sectional views showing manufacturing steps of a semiconductor device of the present invention.

After that, an interlayer insulating layer 128 is formed as shown in FIG. 4A. As the interlayer insulating layer 128, a borophosphosilicate glass (BPSG) layer is formed or an organic resin typified by polyimide is formed by coating. In the interlayer insulating layer 128, a contact hole 129 is formed.

Figure 4B:
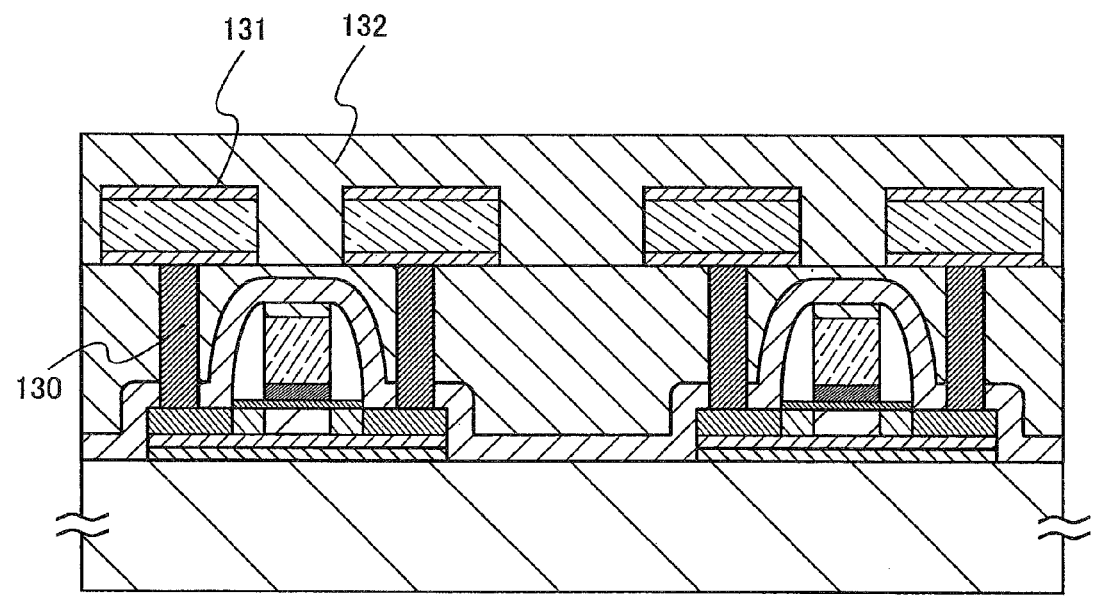

FIG. 4B shows the stage of forming a wiring. In the contact hole 129, a contact plug 130 is formed. As the contact plug 130, tungsten silicide is formed by a chemical vapor deposition method from a $WF_6$ gas and a $SiH_4$ gas to fill the contact hole 129. Alternatively, tungsten may be formed by hydrogen reduction of $WF_6$ to fill the contact hole 129. After that, a wiring 131 is formed to match the contact plug 130. The wiring 131 is formed of aluminum or an aluminum alloy, and an upper layer and a lower layer thereof are formed using metal layers of molybdenum, chromium, titanium, or the like as barrier metal. Furthermore, an interlayer insulating layer 132 is formed thereover. The wiring may be provided appropriately, and a multilayer wiring may be formed by further forming a wiring layer thereover. In that case, a damascene process may be employed.

In this manner, field-effect transistors can be manufactured using the semiconductor layers 106a and 106b that are bonded to the supporting substrate 100. The semiconductor layers 106a and 106b are formed of a semiconductor that has uniform crystal orientation; therefore, uniform, high-performance field-effect transistors can be obtained. In other words, it is possible to suppress inhomogeneity of values of important transistor characteristics, such as threshold voltage and mobility, and to achieve higher performance such as higher mobility.

A groove is formed in a part of a semiconductor substrate to form an isolated projecting portion before heat treatment for separation of the semiconductor substrate is performed. After that, the isolated projecting portion is bonded to a supporting substrate, and the heat treatment for separation of the semiconductor substrate is performed. Because the supporting substrate shrinks due to the heat treatment for separation of the semiconductor substrate, the position of an SOI layer that is bonded to the supporting substrate also changes. However, the SOI layer is not continuously bonded onto the supporting substrate and is isolated. Therefore, the generation of distortion stress on the SOI layer due to the shrinkage of the supporting substrate can be suppressed, and film separation and a decrease of bonding strength can be reduced. In addition, if the projecting portion is made to roughly correspond to a region to be exposed to light at a time by a light exposure apparatus, a light exposure step can be performed efficiently. As a result, a semiconductor device can be manufactured with high yield.

Embodiment Mode 2

A method for manufacturing a semiconductor device, which is different from that in the above mode, is described with reference to FIGS. 8A to 10C. Here, manufacture of a semiconductor device, by which a semiconductor substrate can be bonded to a supporting substrate with high yield, is described.

Figure 8A:
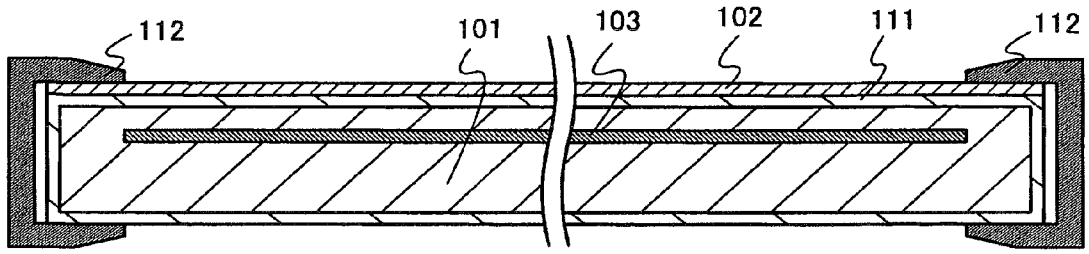
FIGS. 8A to 8D are cross-sectional views showing manufacturing steps of a semiconductor device of the present invention.

As shown in FIG. 8A, degreasing cleaning is performed on the surface of a semiconductor substrate 101; an oxide film on the surface is removed; and thermal oxidation is performed. As thermal oxidation, general dry oxidation may be performed; however, oxidation in an oxidizing atmosphere to which a halogen is added is preferably performed. For example, heat treatment is performed at a temperature of 700° C. or higher in an atmosphere which contains HCl at 0.5 volume % to 10 volume % (preferably, 3 volume %) with respect to oxygen. The thermal oxidation is preferably performed at a temperature of 950° C. to 1100° C. The processing time may be 0.1 hours to 6 hours, preferably, 0.5 hours to 1 hour. The thickness of an oxide film to be formed is set to be 10 nm to 1000 nm (preferably, 50 nm to 200 nm), for example, 100 nm.

As the one that contains a halogen, besides HCl, one or more selected from HF, $NF_3$, HBr, $Cl_2$, $ClF_3$, $BCl_3$, $F_2$, and $Br_2$ can be applied.

Through the heat treatment performed within such a temperature range, a gettering effect by a halogen element can be obtained. Gettering is particularly effective in removing a metal impurity. That is, an impurity such as a metal is detached into a gas phase as a volatile halide and is removed due to the action of a halogen. This is effective for the surface of the semiconductor substrate 101 that has been subjected to chemical mechanical polishing (CMP). In addition, hydrogen acts to compensate defects at the interface between the semiconductor substrate 101 and an oxide film 111 and to lower a local level density at the interface.

The oxide layer 111 formed by this heat treatment can be made to contain a halogen. When containing a halogen element at a concentration of $1\times10^{16}/cm^3$ to $5\times10^{20}/cm^3$, the oxide layer 111 can function as a protective layer which captures an impurity such as a metal and prevents the contamination of the semiconductor substrate 101.

Next, as in the step shown in FIG. 1A, a blocking layer 102 may be formed over the oxide layer 111. The formation of the blocking layer 102 and the oxide layer 111 can prevent a semiconductor layer from being mixed with an impurity element from a supporting substrate.

Figure 10A:
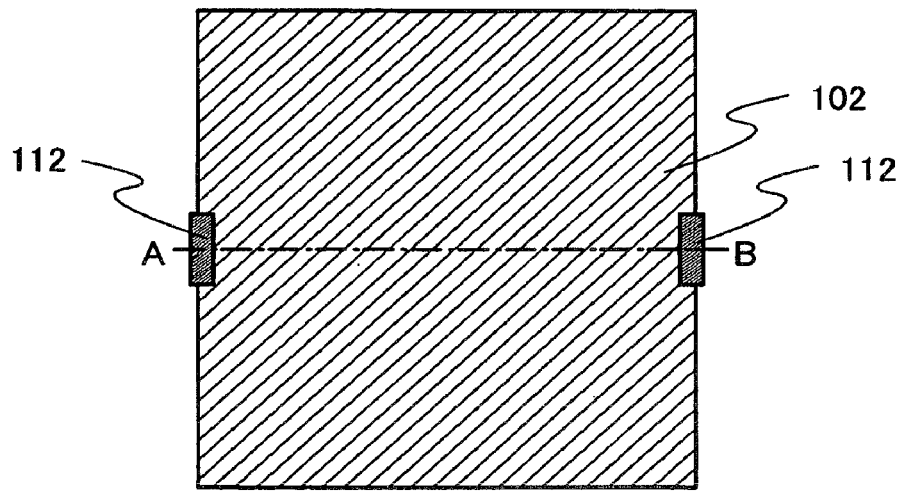
FIGS. 10A to 10C are top views showing a manufacturing step of a semiconductor device of the present invention.

Next, a brittle region 103 is formed in the semiconductor substrate 101. FIG. 10A shows a schematic top view of the semiconductor substrate that is fixed by a clamp. Note that a cross-sectional view of FIG. 10A along A-B corresponds to FIG. 8A.

In order to control the position (depth) of the brittle region 103 and the dose of accelerated ions, an end portion of the semiconductor substrate 101 needs to be fixed by a clamp 112. However, in a region covered by the clamp, the clamp 112 serves as a mask, and the semiconductor substrate 101 cannot be irradiated with ions. Therefore, it is difficult to cause separation in the region, and there is a problem in that a semiconductor layer with different thicknesses is bonded.

Figure 8B:
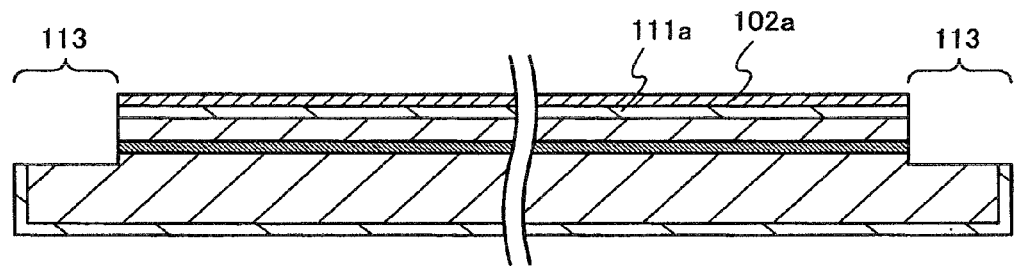

Thus, as shown in FIG. 8B, a portion of the semiconductor substrate 101 covered with the clamp 112 is removed to form a groove 113. The groove 113 can be formed in a similar manner to the groove 107 of FIG. 1A. At this time, a projecting portion is formed on the semiconductor substrate 101. In the projecting portion, the brittle region 103 is formed continuously. The blocking layer 102 that is partly etched is referred to as a blocking layer 102a. Note that the brittle region 103 that is formed continuously refers to a brittle region that is formed across the entire projecting portion.

Figure 10B:
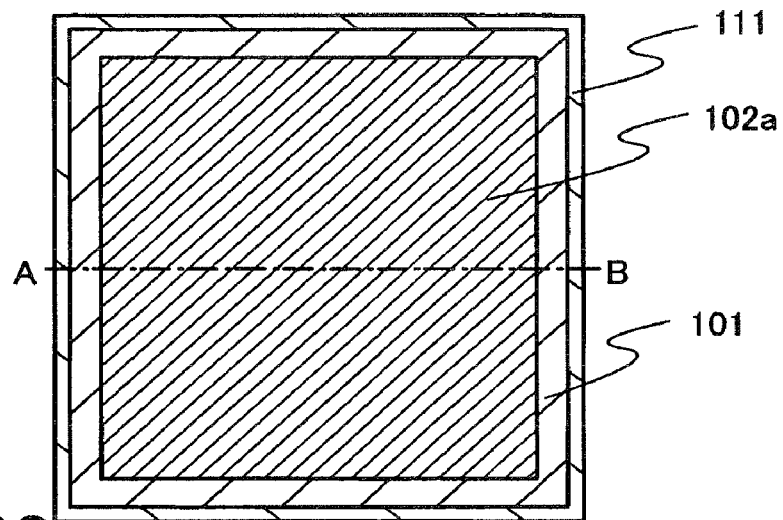

FIG. 10B shows a schematic top view of the semiconductor substrate where the groove is formed. Note that a cross-sectional view of FIG. 10B along A-B corresponds to FIG. 8B.

Figure 8C:
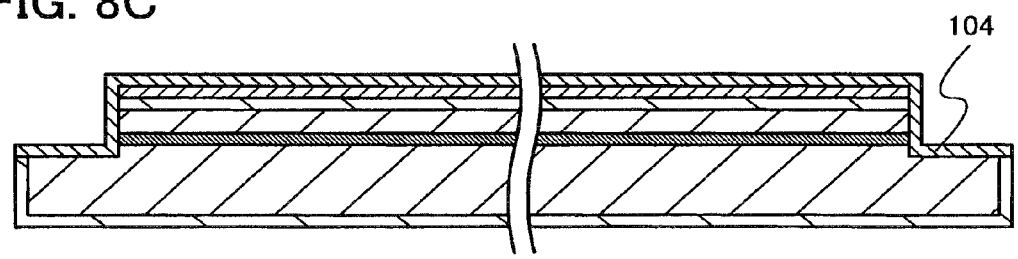

Next, as shown in FIG. 8C, a bonding layer 104 is formed over the blocking layer 102a and the projecting portion of the semiconductor substrate.

Figure 8D:
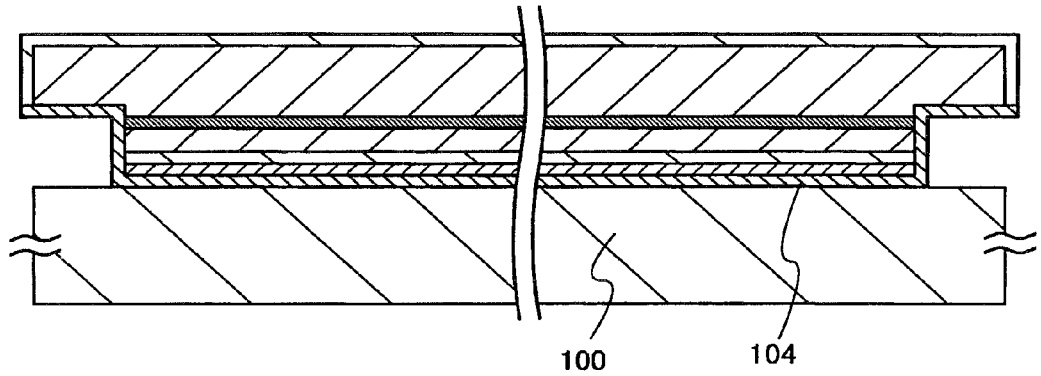

Next, as shown in FIG. 8D, the surface of the bonding layer 104 and the surface of a supporting substrate 100 are subjected to degreasing treatment and sufficiently cleaned in a similar manner to Embodiment Mode 1. Next, treatment for attaching a plurality of hydroxyl groups is applied to the surface of the bonding layer 104 and/or the surface of the supporting substrate 100. Alternatively, the surface of the bonding layer 104 and/or the surface of the supporting substrate 100 is irradiated with an ion beam to clean the surface and to activate the surface. After this, the supporting substrate 100 and the bonding layer 104 are located in contact with each other and bonded together. By pressure bonding of the supporting substrate 100 and the semiconductor substrate 101, the supporting substrate 100 and the semiconductor substrate 101 can be firmly bonded together.

Figure 9A:
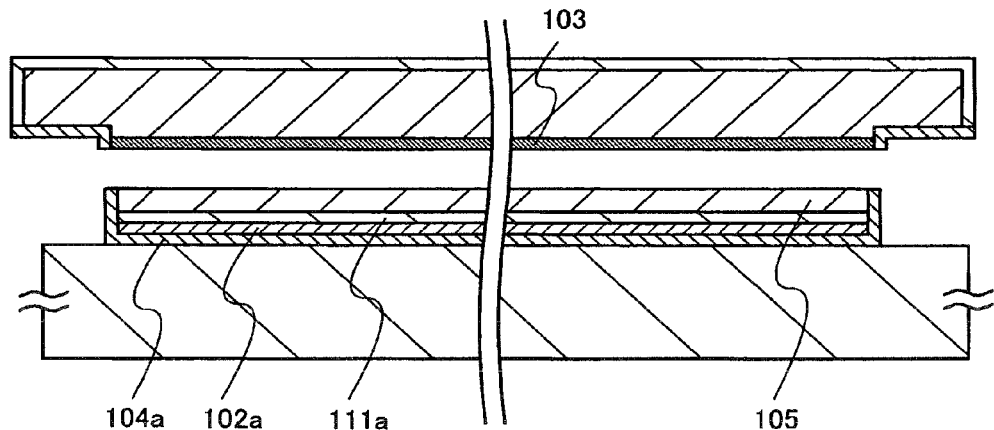
FIGS. 9A to 9C are cross-sectional views showing manufacturing steps of a semiconductor device of the present invention.

FIG. 9A shows the stage of separating an SOI layer 105 from the semiconductor substrate 101. After the semiconductor substrate 101 and the supporting substrate 100 are superposed on each other and located in contact with each other to bond the bonding layer 104 to the supporting substrate 100, heat treatment is performed, which allows the semiconductor substrate 101 to be separated while the SOI layer 105 is left remaining over the supporting substrate 100 and to increase bonding strength between the bonding surfaces. The heat treatment is preferably performed at a temperature equal to or higher than the temperature at which the bonding layer 104 is formed, at equal to or higher than 400° C. to lower than 600° C. Through the heat treatment performed within this temperature range, a change occurs in the volume of microvoids formed in the brittle region 103, which allows a semiconductor layer to be separated along the brittle region 103. Because the bonding layer 104 is bonded to the supporting substrate 100, the SOI layer 105 having the same crystallinity as that of the semiconductor substrate 101 is bonded onto the supporting substrate 100.

If the heat treatment is performed, hydrogen bonds at the bonding surface between the supporting substrate 100 and the bonding layer 104a can be changed into stronger covalent bonds. In addition, it is preferable that the SOI layer 105 be irradiated with an energy beam to compensate crystal defects.

Figure 10C:
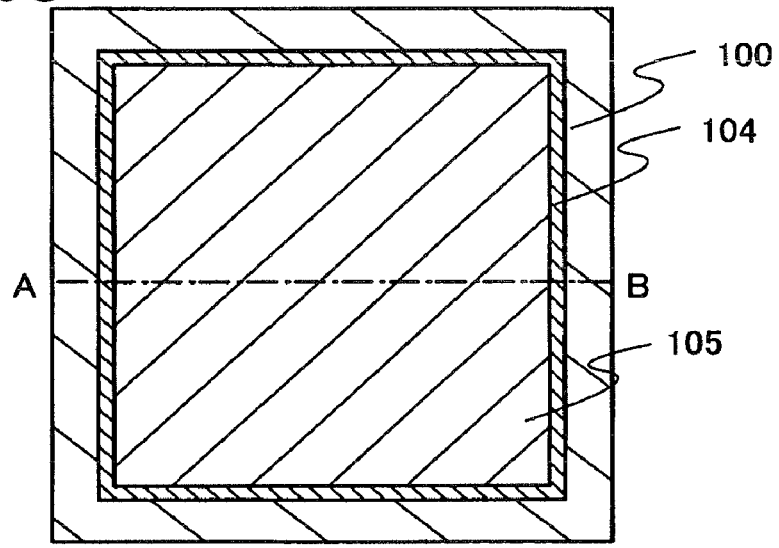

FIG. 10C shows a schematic top view of the supporting substrate to which the SOI layer is bonded. Note that a cross-sectional view of FIG. 10C along A-B corresponds to FIG. 9A. Because a region of the semiconductor substrate where the clamp is provided is not irradiated with accelerated ions, there is a problem in that the semiconductor substrate cannot be separated and the semiconductor substrate remains in the region. However, by removal of the region of the semiconductor substrate where the clamp is provided and formation of the groove according to this embodiment mode, an SOI layer with a predetermined thickness can be bonded onto the supporting substrate.

Through the above steps, an SOI substrate can be manufactured.

Figure 9B:
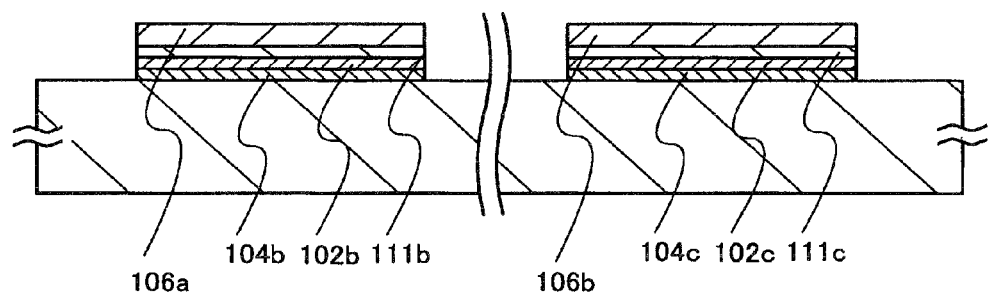
Figure 9C:
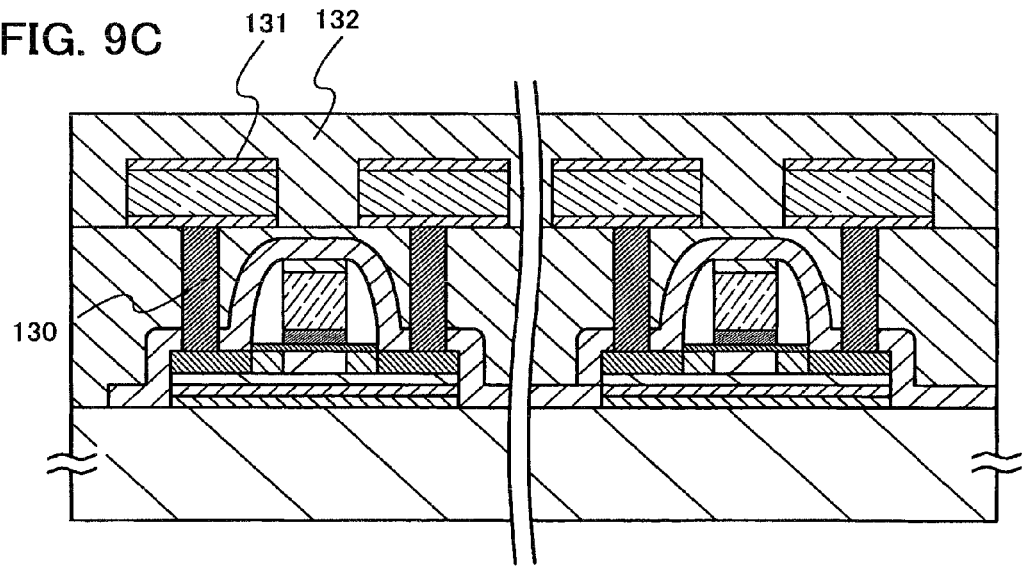

Next, the SOI layer 105 is selectively etched to form semiconductor layers 106a and 106b as shown in FIG. 9B. Here, resist masks are formed by a photolithography step to cover parts of the SOI layer 105, and the SOI layer 105 is selectively etched to form the semiconductor layers 106a and 106b. Note that, as well as the SOI layer 105, an oxide layer 111a, the blocking layer 102a, and a bonding layer 104a may be etched.

The semiconductor layers 106a and 106b are provided over the supporting substrate 100 with oxide layers 111b and 111c, blocking layers 102b and 102c, and bonding layers 104b and 104c being interposed therebetween. The blocking layers 102b and 102c may be provided on the supporting substrate 100 side. When the blocking layers 102b and 102c are provided, the semiconductor layers 106a and 106b can be prevented from being contaminated.

Note that, in this embodiment mode, as shown in FIG. 8A, the groove 113 is formed in the semiconductor substrate 101 after the brittle region 103 is formed. Alternatively, the brittle region 103 may be formed after the groove 113 is formed in the region of the semiconductor substrate 101 covered with the clamp 112.

In Embodiment Mode 1, this embodiment mode can be used appropriately.

By use of the semiconductor layers 106a and 106b bonded to the supporting substrate 100 in this manner, field-effect transistors can be manufactured. The semiconductor layers 106a and 106b are semiconductor layers that have uniform crystal orientation; therefore, uniform, high-performance field-effect transistors can be obtained. In other words, it is possible to suppress inhomogeneity of values of important transistor characteristics, such as threshold voltage and mobility, and to achieve higher performance such as higher mobility.

According to this mode, the semiconductor layers 106a and 106b that have high bonding strength at a bonding portion can be obtained even if the supporting substrate 100 has an upper temperature limit of 700° C. or lower like a glass substrate or the like. As the supporting substrate 100, it is possible to use any of a variety of glass substrates that are used in the electronics industry and that are referred to as non-alkali glass substrates, such as aluminosilicate glass substrates, aluminoborosilicate glass substrates, and barium borosilicate glass substrates. In other words, a semiconductor layer can be formed over a substrate that is longer than one meter on each side. With the use of such a large-sized substrate, not only a display device such as a liquid crystal display but also a semiconductor integrated circuit can be manufactured. In addition, a gettering effect on a semiconductor substrate can be obtained by thermal oxidation performed in an atmosphere which contains a halogen at the first stage of the process, which is effective in reusing the semiconductor substrate.

In addition, the oxide layers 111b and 111c that contain a halogen are provided on the back channel side (the side opposite to a gate electrode 122) of the semiconductor layers 106a and 106b, and local level density is decreased; therefore, variation of threshold voltages can be suppressed. Furthermore, the blocking layers 102b and 102c as well as the oxide layers 111b and 111c that contain a halogen are provided between the supporting substrate 100 and the semiconductor layers 106a and 106b; therefore, the semiconductor layers 106a and 106b can be prevented from being contaminated by diffusion of a metal impurity such as sodium from the supporting substrate 100 side.

In addition, because a continuous brittle layer is formed in the projecting portion of the semiconductor substrate, an SOI layer with a predetermined thickness can be bonded onto a supporting substrate. Therefore, by use of the semiconductor layer, a semiconductor device can be manufactured with high yield.

Embodiment Mode 3

A method for manufacturing a semiconductor device, which is different from that in the above mode, is described with reference to FIGS. 21A to 21C. Here, manufacture of a semiconductor device, by which a semiconductor substrate can be bonded to a supporting substrate with high yield, is described.

Figure 21A:
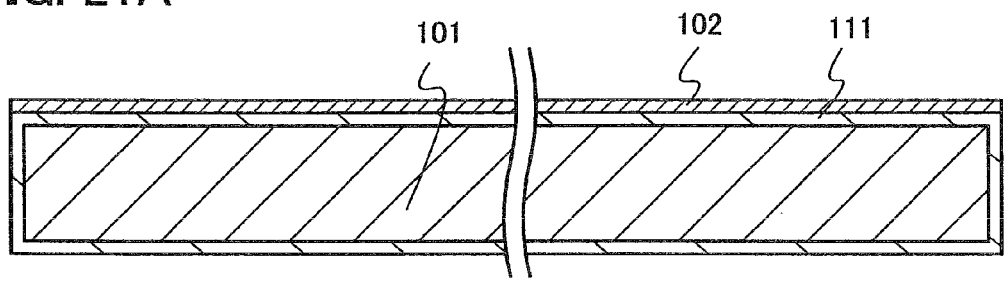
FIGS. 21A to 21C are cross-sectional views showing manufacturing steps of a semiconductor device of the present invention.

In a similar manner to Embodiment Mode 2, as shown in FIG. 21A, degreasing cleaning is performed on the surface of a semiconductor substrate 101; an oxide film on the surface is removed; and then, thermal oxidation is performed to form an oxide layer 111 on the surface of the semiconductor substrate 101. Here, by oxidation in an oxidizing atmosphere into which a halogen is introduced, gettering of a metal impurity by a halogen element is performed to compensate defects at the interface between the semiconductor substrate 101 and the oxide layer 111 and to lower local level density at the interface.

Next, in a similar manner to Embodiment Mode 2, a blocking layer 102 may be formed over the oxide layer 111.

Figure 21B:
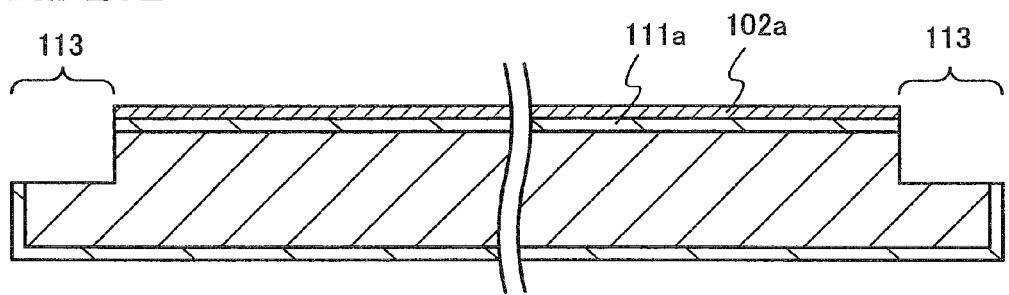

Next, as shown in FIG. 21B, a groove 113 is formed. The groove 113 can be formed in a similar manner to the groove 107 of FIG. 1A. At this time, a projecting portion is formed on the semiconductor substrate 101. The blocking layer 102 that is partly etched is referred to as a blocking layer 102a. The oxide layer 111 that is partly etched is referred to as an oxide layer 111a.

Figure 21C:
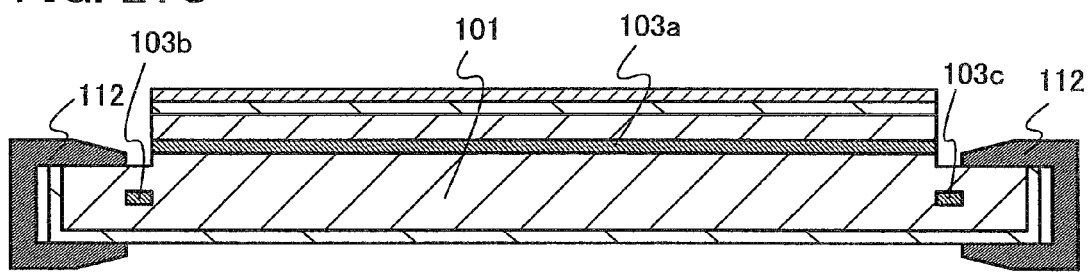

Next, as shown in FIG. 21C, brittle regions 103a to 103c are formed in the semiconductor substrate 101. Here, after the semiconductor substrate 101 is fixed by a clamp 112 in a region where the groove 113 is formed, the semiconductor substrate 101 is irradiated with accelerated ions to form the brittle regions 103a to 103c. In the projecting portion, the brittle region 103a is formed continuously. That is, the brittle region 103a can be formed across the entire projecting portion.

After this, in a similar manner to FIG. 8C of Embodiment Mode 2, a bonding layer 104 is formed over the blocking layer 102a and the projecting portion of the semiconductor substrate. After this, in a similar step to that of Embodiment Mode 2, a supporting substrate 100 and the semiconductor substrate 101 are firmly bonded together, and then, the semiconductor substrate 101 is separated at the brittle region 103, whereby an SOI substrate in which an SOI layer 105 is provided over the supporting substrate 100 can be manufactured. In addition, as in Embodiment Mode 2, by use of the SOI layer 105, a field-effect transistor can be manufactured.

In this embodiment mode, because a continuous brittle layer is formed in the projecting portion of the semiconductor substrate, an SOI layer with a predetermined thickness can be bonded onto a supporting substrate. Therefore, by use of the semiconductor layer, a semiconductor device can be manufactured with high yield.

Embodiment Mode 4

In this embodiment mode, a method for manufacturing a flexible semiconductor device is described with reference to FIGS. 11A to 14B.

Figure 11A:
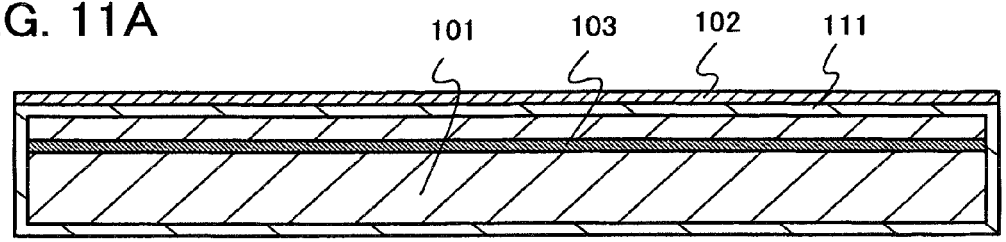
FIGS. 11A to 11D are cross-sectional views showing manufacturing steps of a semiconductor device of the present invention.

As shown in FIG. 11A, in a similar manner to Embodiment Mode 2, after an oxide layer on the surface of a semiconductor substrate 101 is removed, an oxide layer is formed by thermal oxidation. Here, heat treatment is performed at 700° C. or higher in an oxidizing atmosphere to which HCl is added, whereby an oxide layer 111 which contains chlorine is formed. Next, a blocking layer 102 is formed over the oxide layer 111. Then, a brittle region 103 is formed in the semiconductor substrate 101.

Figure 11B:
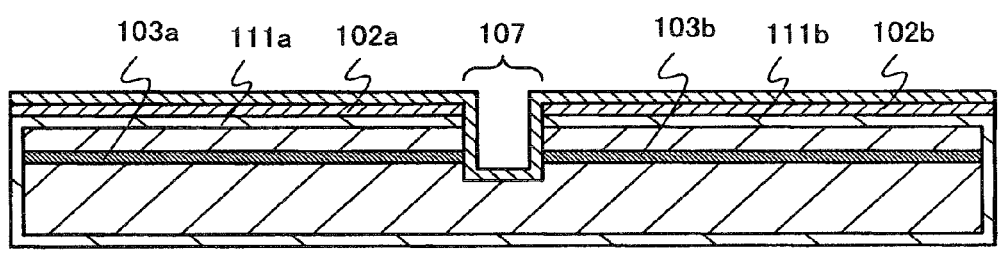

Next, as shown in FIG. 11B, a part of the semiconductor substrate 101 is removed to form a groove 107. At this time, projecting portions are formed on the semiconductor substrate 101. The blocking layer 102 that is partly etched is referred to as blocking layers 102a and 102b. The brittle region 103 that is partly etched is referred to as brittle regions 103a and 103b. Next, a bonding layer 104 is formed over the blocking layers 102a and 102b and the projecting portions of the semiconductor substrate. Note that, in the case where a bonding layer is formed over the surface of a supporting substrate, the bonding layer 104 does not necessarily need to be provided.

Figure 11C:
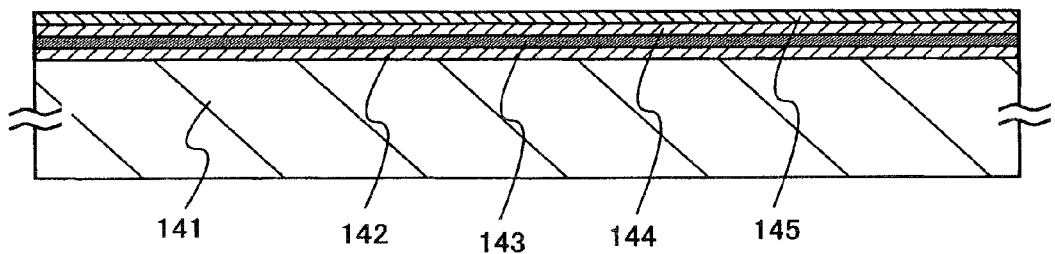

Next, as shown in FIG. 11C, a base layer 142 is formed over a supporting substrate 141; a separation layer 143 is formed over the base layer 142; a blocking layer 144 is formed over the separation layer 143; and a bonding layer 145 is formed over the blocking layer 144. Note that, in the case where a bonding layer is provided over the surface of the semiconductor substrate, the bonding layer 145 does not necessarily need to be provided.

Here, the supporting substrate 141 is preferably a substrate that has heat resistance sufficient to withstand the temperature of heat treatment for formation of a crack in the brittle region (typically, 400° C. to 600° C.), and typically, a glass substrate, a quartz substrate, a ceramic substrate, a metal substrate, a silicon wafer, or the like can be used.

The base layer 142 can be formed in a similar manner to the blocking layer 102. In the case where the adhesion between the supporting substrate 141 and the separation layer 143 is high, the base layer 142 does not necessarily need to be provided.

The separation layer 143 is formed by a sputtering method, a plasma CVD method, a coating method, a printing method, or the like using a single layer of or a stacked layer of a plurality of layers of an element selected from tungsten, molybdenum, titanium, tantalum, niobium, nickel, cobalt, zirconium, zinc, ruthenium, rhodium, palladium, osmium, iridium, and silicon, an alloy material containing any of the elements as it main component, or a compound material containing any of the elements as its main component. In the case where a silicon-containing layer is formed as the separation layer 143, the crystal structure of the silicon-containing layer may be any one of amorphous, microcrystalline, and polycrystalline structures. Here, a coating method refers to a formation method by discharge of a solution over an object and includes, for example, a spin coating method and a droplet discharge method. A droplet discharge method refers to a method of forming a pattern of a predetermined shape by discharge of droplets of a composition that contains fine particles from a minute hole.

In the case where the separation layer 143 is formed to have a single-layer structure, a layer that contains tungsten, molybdenum, or a mixture of tungsten and molybdenum is formed. Alternatively, a layer that contains an oxide or an oxynitride of tungsten, a layer that contains an oxide or an oxynitride of molybdenum, or a layer that contains an oxide or an oxynitride of a mixture of tungsten and molybdenum is formed. Note that the mixture of tungsten and molybdenum corresponds to an alloy of tungsten and molybdenum, for example.

In the case where the separation layer 143 is formed to have a stacked-layer structure, a metal layer is formed as a first layer and a metal oxide layer is formed as a second layer. Typically, a layer that contains tungsten, molybdenum, or a mixture of tungsten and molybdenum is formed as a first layer, and a layer that contains an oxide of tungsten, molybdenum, or a mixture of tungsten and molybdenum, a nitride of tungsten, molybdenum, or a mixture of tungsten and molybdenum, an oxynitride of tungsten, molybdenum, or a mixture of tungsten and molybdenum, or a nitride oxide of tungsten, molybdenum, or a mixture of tungsten and molybdenum is formed as a second layer.

In the case where the separation layer 143 is formed to have a stacked-layer structure of a metal layer as a first layer and a metal oxide layer as a second layer, the separation layer 143 may be formed utilizing the fact that, by formation of a metal layer, for example, a layer that contains tungsten and by formation of an interlayer insulating layer 132 of an oxide, for example, a silicon oxide layer over the metal layer, a metal oxide layer, for example, a layer that contains of an oxide of tungsten is formed at the interface between the layer that contains tungsten and the insulating layer. Alternatively, a metal oxide layer may be formed by performance of thermal oxidation treatment, oxygen plasma treatment, treatment with a solution having strong oxidizing power such as ozone water, or the like to the surface of a metal layer.

Still alternatively, as the separation layer 143, a metal layer may be formed as a first layer, and a metal nitride layer or a metal oxynitride layer may be formed as a second layer. Typically, a layer that contains tungsten may be formed as a first layer, and then, a tungsten nitride layer or a tungsten oxynitride layer may be formed as a second layer.

The blocking layer 144 can be formed in a similar manner to the blocking layer 102 described in Embodiment Mode 1.

The bonding layer 145 can be formed in a similar manner to the bonding layer 104 described in Embodiment Mode 1.

Figure 11D:
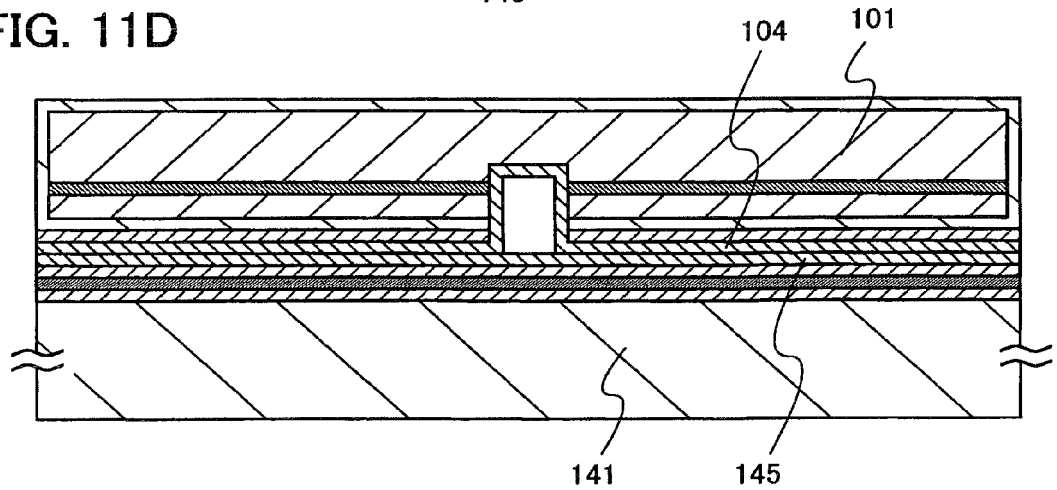

Next, as shown in FIG. 11D, the surface of the bonding layer 104 and the surface of the supporting substrate 141 are sufficiently cleaned in a similar manner to Embodiment Mode 1. Next, the surface of the bonding layer 104 and/or the surface of the supporting substrate 141 is subjected to treatment for attaching a plurality of hydroxyl groups. Alternatively, the surface of the bonding layer 104 and/or the surface of the supporting substrate 141 is irradiated with an ion beam to clean the surface and to activate the surface. After this, the bonding layer 145 formed over the supporting substrate 141 is located in contact with the bonding layer 104 formed over the semiconductor substrate 101 to bond the two together.

Here, a stacked-layer structure on the surface of the semiconductor substrate and a stacked-layer structure of the supporting substrate are described with reference to FIGS. 14A and 14B.

Figure 14A:
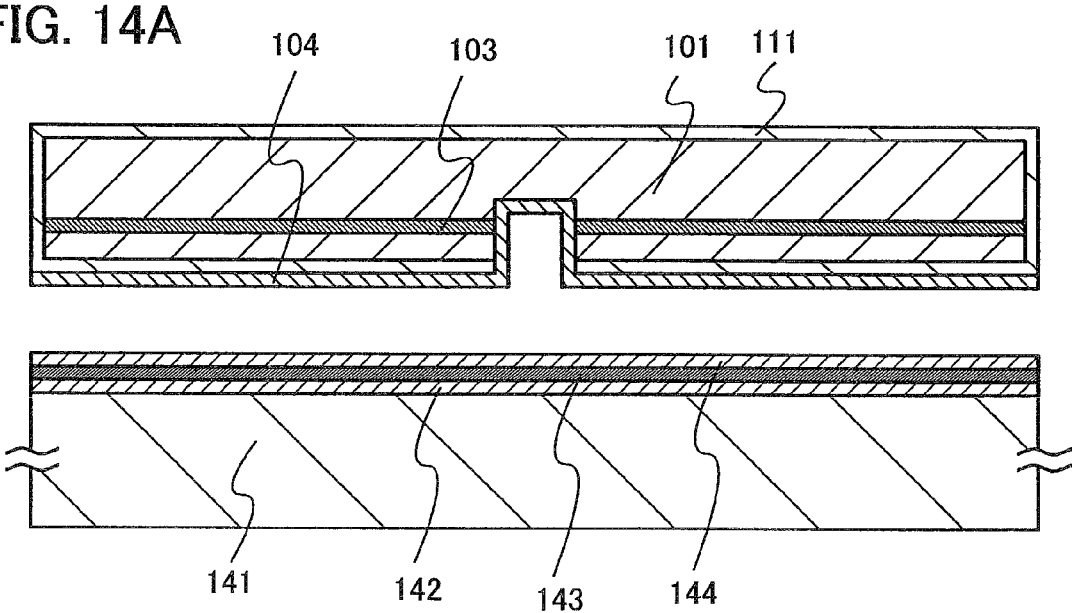
FIGS. 14A and 14B are cross-sectional views showing manufacturing steps of a semiconductor device of the present invention.

As shown in FIG. 14A, a three-layer structure of the base layer 142, the separation layer 143, and the blocking layer 144 may be provided over the supporting substrate 141, and the oxide layer 111 and the bonding layer 140 may be stacked on the surface of the semiconductor substrate 101. By locating the supporting substrate 141 and the semiconductor substrate 101 having such structures in contact with each other, the blocking layer 144 and the bonding layer 104 can be bonded together.

Alternatively, although not shown, a four-layer structure of a base layer, a separation layer, a blocking layer, and a bonding layer may be provided over a supporting substrate, and an oxide layer may be provided on the surface of a semiconductor substrate. By locating the supporting substrate and the semiconductor substrate having such structures in contact with each other, the bonding layer and the oxide layer can be bonded together.

That is, when a blocking layer is provided over one of the supporting substrate 141 and the semiconductor substrate 101, an impurity from the outside can be prevented from being mixed into a semiconductor layer. In addition, when a bonding layer is provided over one of the supporting substrate 141 and the semiconductor substrate 101, the supporting substrate 141 and the semiconductor substrate 101 can be bonded together. Furthermore, the number of layers to be stacked over the supporting substrate 141 and the semiconductor substrate 101 can be reduced and throughput can be increased.

Figure 14B:
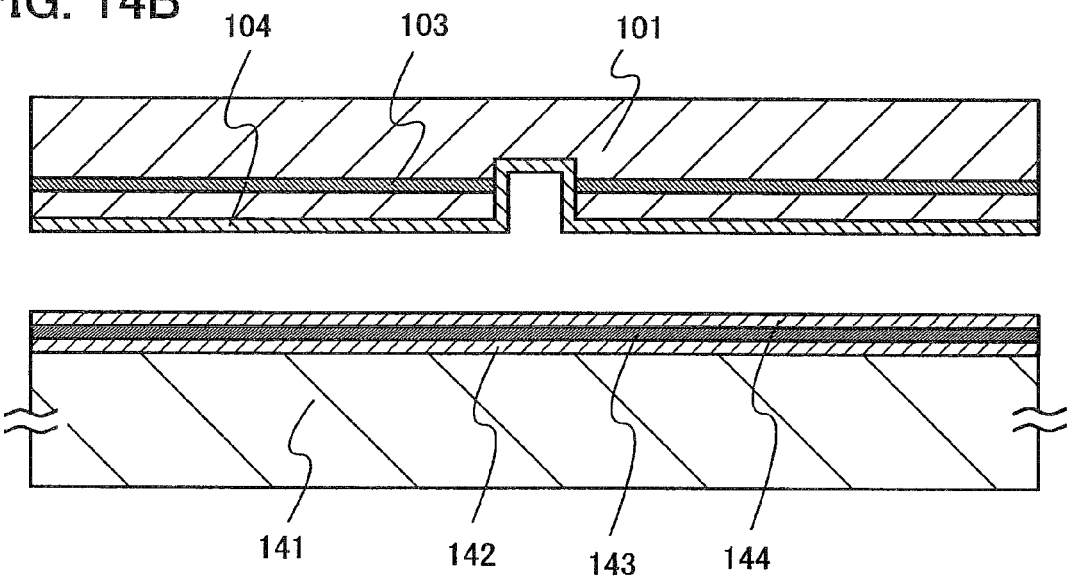

Alternatively, as shown in FIG. 14B, the bonding layer 104 may be formed in contact with the semiconductor substrate 101 without forming an oxide layer by thermal oxidation of the semiconductor substrate 101. In this case, a stacked-layer structure of the base layer 142, the separation layer 143, and the blocking layer 144 is provided over the supporting substrate 141.

Alternatively, although not shown, when a four-layer structure of a base layer, a separation layer, a blocking layer, and a bonding layer is provided over a supporting substrate and the supporting substrate and a semiconductor substrate are located in contact with each other, the bonding layer and an oxide layer can be bonded together.

That is, even if no thermal oxide layer is provided, when a blocking layer is provided over the supporting substrate 141, an impurity from the outside can be prevented from being mixed into a semiconductor layer. In addition, when a bonding layer is provided over one of the supporting substrate 141 and the semiconductor substrate 101, the supporting substrate 141 and the semiconductor substrate 101 can be bonded together. Furthermore, the number of layers to be stacked over the supporting substrate 141 and the semiconductor substrate 101 can be reduced and throughput can be increased.

Figure 12A:
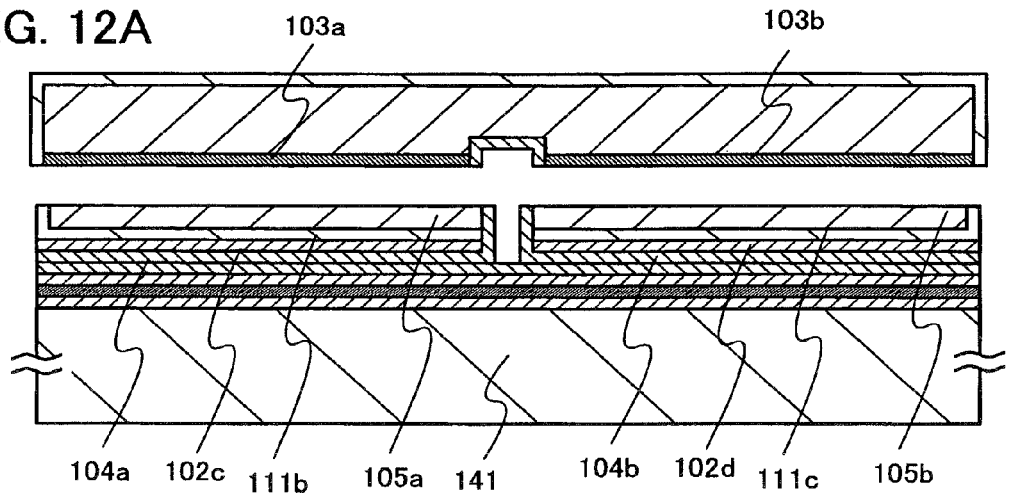
FIGS. 12A to 12C are cross-sectional views showing manufacturing steps of a semiconductor device of the present invention.

Next, as shown in FIG. 12A, heat treatment, pressure treatment, or heat treatment and pressure treatment is performed to separate the semiconductor substrate 101 from the supporting substrate 141 with the brittle regions 103a and 103b used as a cleavage plane (referring to a region where a single-crystal semiconductor substrate is separated and also referred to as a separation region) and also to increase bonding strength between the bonding surfaces. It is preferable that the temperature of heat treatment be equal to or lower than the upper temperature limit of the supporting substrate 141. For example, by heat treatment performed at 400° C. to 600° C., a change occurs in the volume of microvoids formed in the brittle regions 103a and 103b, which allows the semiconductor substrate 101 to be separated along the brittle regions 103a and 103b.

At this time, instead of heat treatment, the semiconductor substrate 101 may be irradiated with a laser beam to cause a change in the volume of microvoids formed in the brittle regions 103a and 103b. As the laser beam, a wavelength which is transmitted through the semiconductor substrate and absorbed by an element contained in the brittle regions 103a and 103b is preferably used, and typically, infrared light can be used.

After the semiconductor substrate 101 is separated from the supporting substrate 141, the surfaces of SOI layers 105a and 105b are preferably planarized. Typically, CMP or irradiation with the laser beam described above is performed. In addition, CMP or the like may be performed in order to reduce the thickness of resulting SOI layers.

Figure 12B:
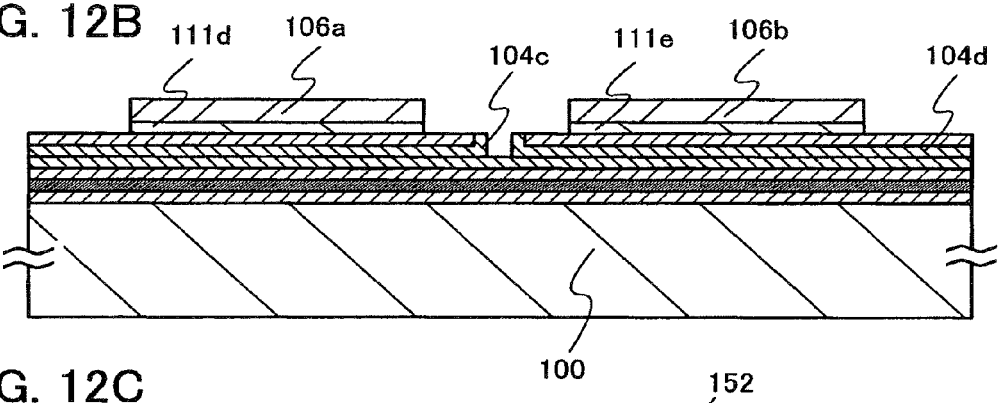

Next, the SOI layers 105a and 105b are selectively etched to form semiconductor layers 106a and 106b as shown in FIG. 12B. Note that, at this time, oxide layers 111b and 111c and bonding layers 104a and 104b may be partly etched. Here, the oxide layers that are partly etched are referred to as oxide layers 111d and 111e, and the bonding layers that are partly etched are referred to as bonding layers 104c and 104d. In addition, blocking layers 102c and 102d, the bonding layers 104a and 104b, and the bonding layer 145 may be selectively etched.

Figure 12C:
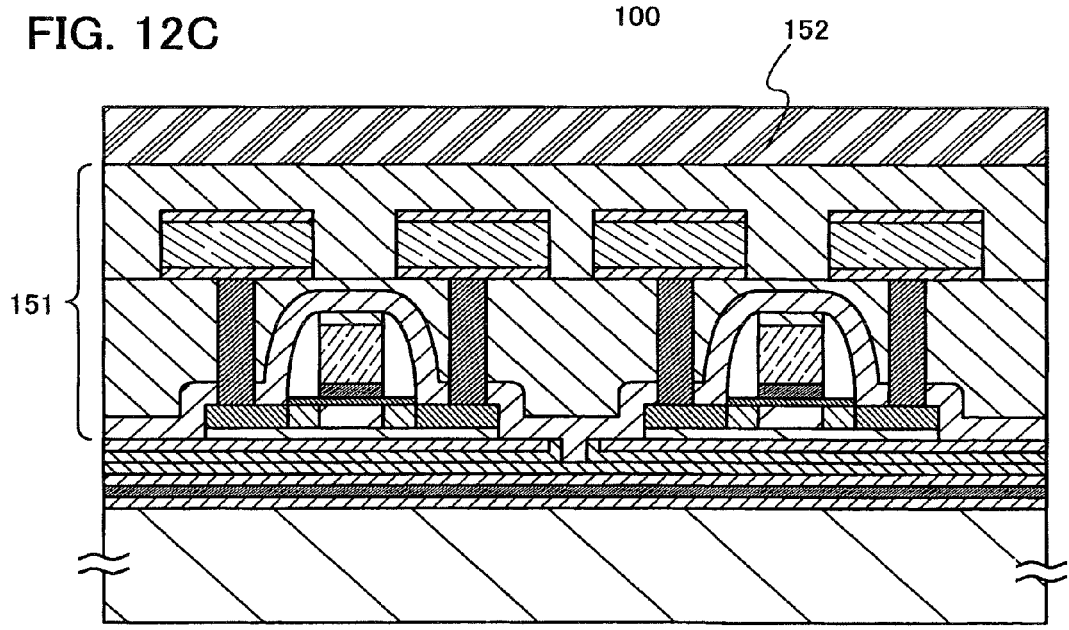

Next through the steps of FIGS. 3A to 4B, as shown in FIG. 12C, an element layer 151 which includes field-effect transistors is formed using the semiconductor layers 106a and 106b. Next, a flexible substrate 152 is provided over the element layer 151. By thermal pressure bonding of the flexible substrate 152 and the element layer 151, the flexible substrate 152 can be fixed to the element layer 151. Alternatively, the flexible substrate 152 can be fixed to the element layer 151 with the use of an adhesive (not shown). The flexible substrate 152 is a substrate that has flexibility and has an insulating surface, and is typically a flexible insulating substrate, a flexible metal substrate with an insulating layer being formed over its surface, or the like. Examples of the flexible insulating substrate include plastic substrates made of polyethylene terephthalate (PET), polyethylenenaphthalate (PEN), polyethersulfone (PES), polypropylene, polypropylene sulfide, polycarbonate, polyetherimide, polyphenylene sulfide, polyphenylene oxide, polysulfone, polyphthalamide, and the like and paper made of a fibrous material.

As the flexible insulating substrate, a prepreg can be used, which enables to prevent an SOI substrate or a semiconductor device to be formed later from being destroyed due to point pressure or linear pressure. Typically, a prepreg is formed in such a manner that, after a fibrous body of polyvinyl alcohol fiber, polyester fiber, polyamide fiber, polyethylene fiber, aramid fiber, polyparaphenylene benzobisoxazole fiber, glass fiber, carbon fiber, or the like is impregnated with varnish in which a matrix resin such as an epoxy resin, an unsaturated polyester resin, a polyimide resin, or a fluorine resin is diluted with an organic solvent, drying is performed so that the organic solvent is volatilized and the matrix resin is semi-cured.

Examples of the flexible metal substrate with an insulating layer being formed over its surface include metal films, metal sheets, and the like provided with an insulating layer such as a silicon oxide layer, a silicon nitride layer, a silicon oxynitride layer, an aluminum nitride layer, or an aluminum oxide layer. Note that the insulating layer is not limited to the insulating layers given above and can be appropriately used.

Figure 13A:
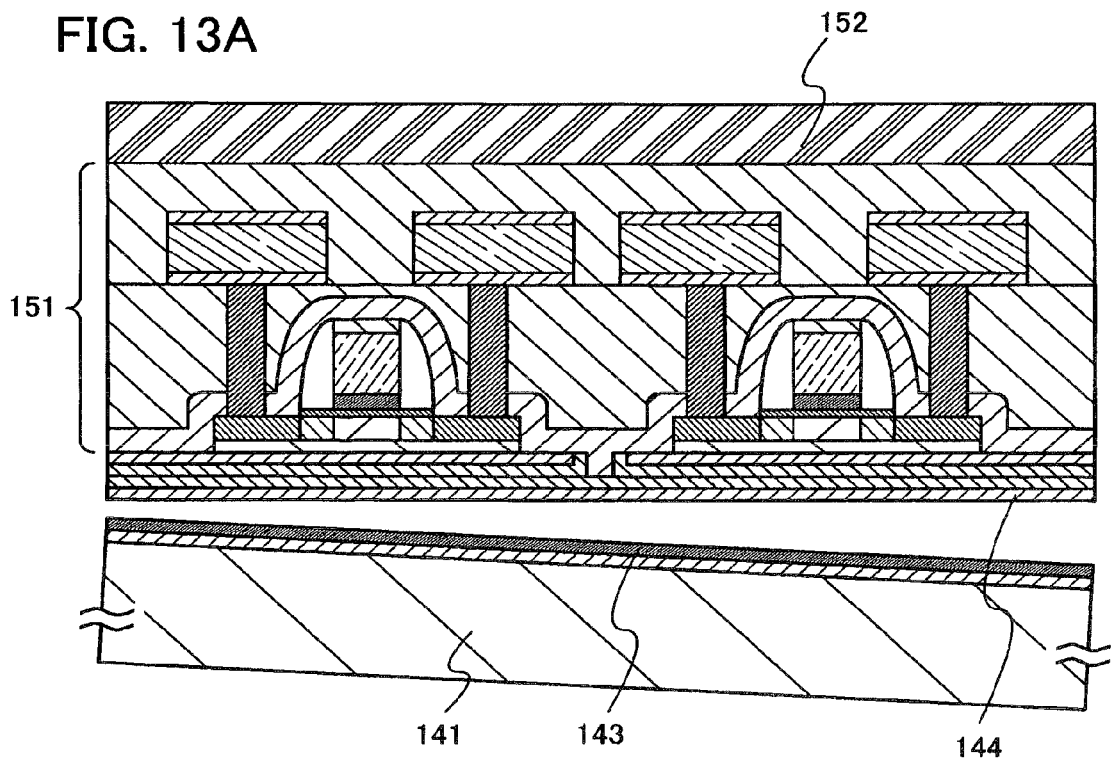
FIGS. 13A and 13B are cross-sectional views showing manufacturing steps of a semiconductor device of the present invention.

Next, as shown in FIG. 13A, a stacked-layer body that includes the flexible substrate 152 and the element layer 151 is separated from the supporting substrate 141 by a physical method. Alternatively, the stacked-layer body that includes the flexible substrate 152 and the element layer 151 is separated from the supporting substrate 141 by permeation of a liquid into the interface between the separation layer 143 and the blocking layer 144.

The physical method refers to a dynamical method or a mechanical method, i.e., a method for changing some dynamical (mechanical) energy. Typically, the physical method refers to application of a mechanical force (e.g., a separation process with a human hand or with a gripper, or a separation process by rotation of a roller). At this time, separation can be performed more easily if an adhesive sheet that can be separated by light or heat is provided on at least one of the surfaces of the supporting substrate 141 and the flexible substrate 152.

Here, separation occurs at the interface between the separation layer 143 and the blocking layer 144, at the separation layer 143, or at the interface between the supporting substrate 141 and the separation layer 143, and the stacked-layer body that includes the element layer 151 and the flexible substrate 152 can be separated from the base layer 142.

Note that, before the stacked-layer body that includes the flexible substrate 152 and the element layer 151 is separated from the supporting substrate 141 at the separation layer 143, a trigger may be formed to easily perform separation. Furthermore, when the stacked-layer body that includes the flexible substrate 152 and the element layer 151 is separated from the supporting substrate 141, separation can be performed more easily if an adhesive sheet that can be separated by light or heat is provided on at least one of surfaces of the supporting substrate 141 and the flexible substrate 152, one of the supporting substrate 141 and the flexible substrate 152 is fixed, and the other is torn.

Figure 13B:
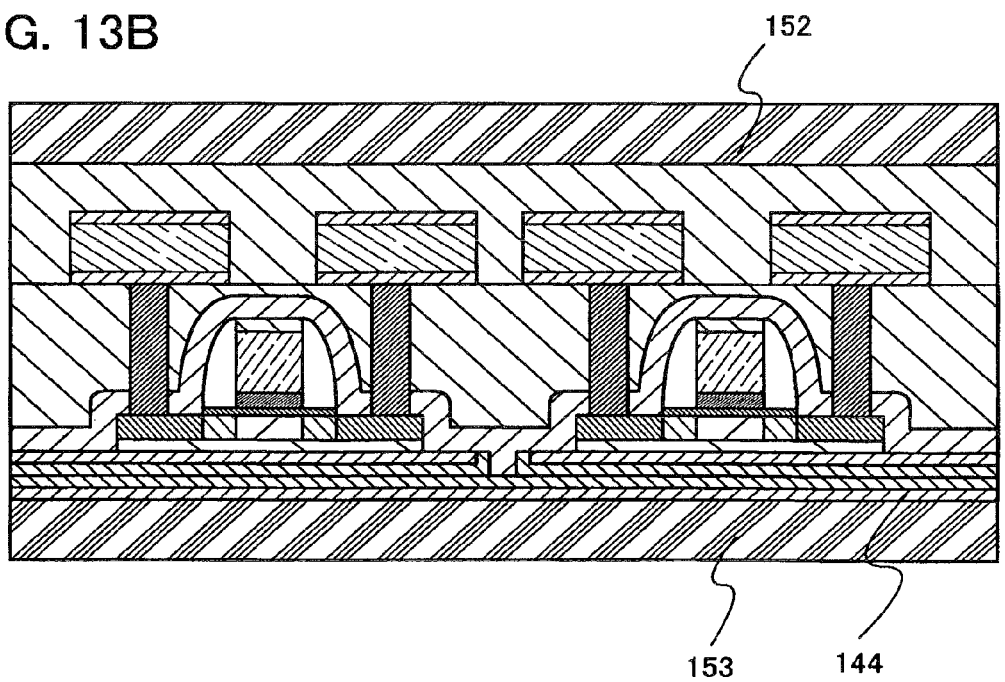

Next, as shown in FIG. 13B, a flexible substrate 153 is attached to the blocking layer 144. As the flexible substrate 153, those listed as the flexible substrate 152 can be used appropriately.

After this, in the case where the element layer 151 includes a plurality of semiconductor devices, the element layer 151 and the flexible substrates 152 and 153 may be divided to cut out the plurality of semiconductor devices. Through such steps, a plurality of thin, flexible semiconductor devices can be manufactured.

In this embodiment mode, after a field-effect transistor is formed using an SOI layer that is bonded onto a supporting substrate, an element layer that includes the field-effect transistor is separated from the supporting substrate, thereby manufacturing a thin, flexible semiconductor device. Because the supporting substrate can be treated more easily than a flexible substrate, it can be easily handled during a manufacturing process and yield can be increased.

Because the SOI layers 105a and 105b formed according to this mode are semiconductor layers that have uniform crystal orientation, uniform, high-performance field-effect transistors can be obtained. In other words, it is possible to suppress inhomogeneity of values of important transistor characteristics, such as threshold voltage and mobility, and to achieve higher performance such as higher mobility. Furthermore, because the blocking layers 102c and 102d are provided between the supporting substrate 100 and the SOI layers 105a and 105b, an impurity from the supporting substrate can be prevented from entering the SOI layers. Thus, it is possible to suppress variation of characteristics among transistors formed in the element layer.

Embodiment Mode 5

In this embodiment mode, a method for manufacturing a semiconductor device, which is different from that of Embodiment Mode 4, is described with reference to FIGS. 22A to 22D. In this embodiment mode, a method for manufacturing a flexible semiconductor device is described.

Figure 22A:
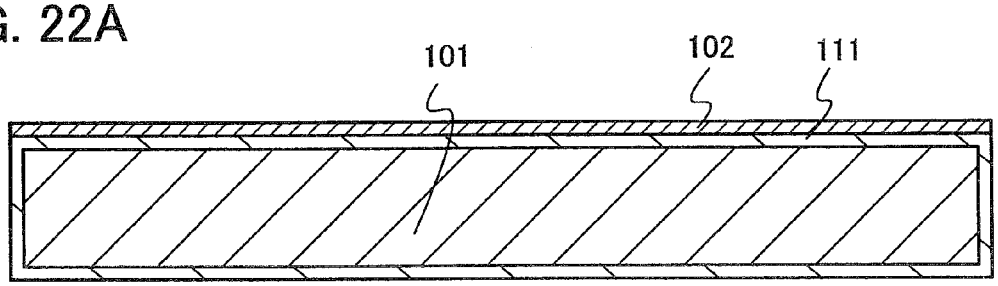
FIGS. 22A to 22D are cross-sectional views showing manufacturing steps of a semiconductor device of the present invention.

As shown in FIG. 22A, in a similar manner to Embodiment Mode 2, a single-crystal semiconductor substrate is used as the semiconductor substrate 101; an oxide layer on its surface is removed; and thermal oxidation is then performed to form an oxide layer 111. Next, a blocking layer 102 is formed over the oxide layer 111.

Figure 22B:
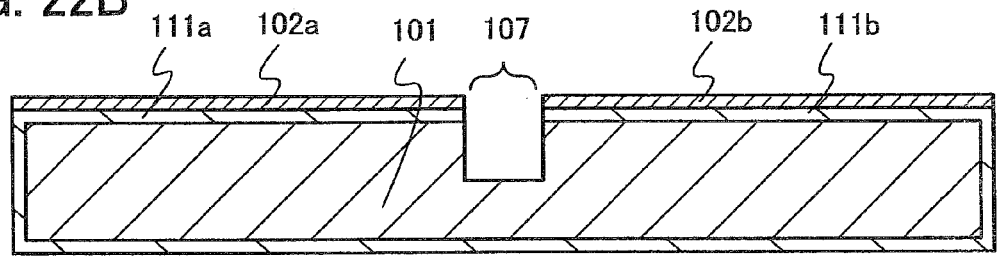

Next, as shown in FIG. 22B, in a similar manner to Embodiment Mode 2, a part of the semiconductor substrate 101 is removed to form a groove 107. At this time, projecting portions are formed on the semiconductor substrate 101. The blocking layer 102 that is partly etched is referred to as blocking layers 102a and 102b.

Figure 22C:
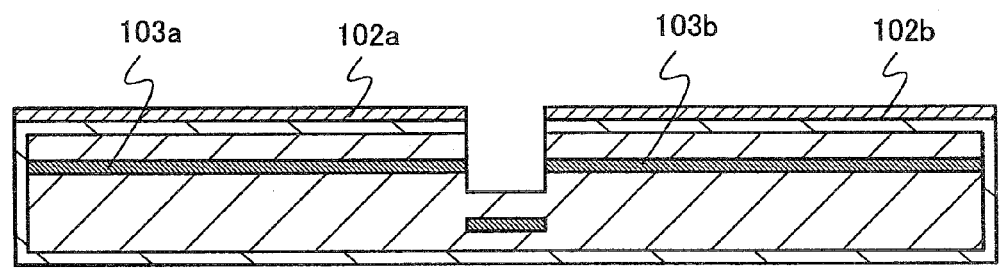

Next, as shown in FIG. 22C, in a similar manner to Embodiment Mode 2, brittle regions 103a to 103c are formed in the semiconductor substrate 101.

Figure 22D:
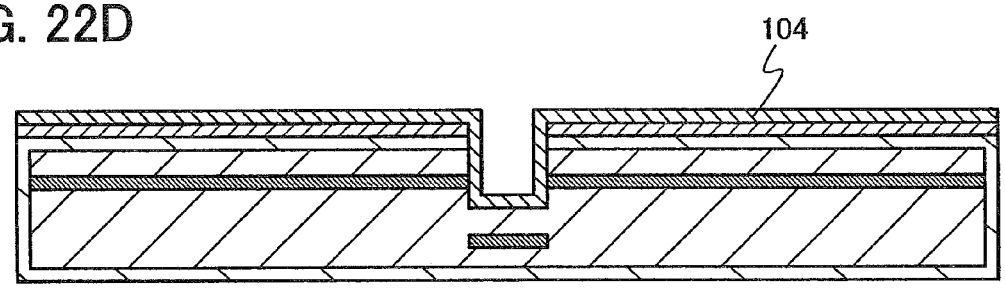

Next, as shown in FIG. 22D, in a similar manner to Embodiment Mode 2, a bonding layer 104 is formed over the blocking layers 102a and 102b and the projecting portions of the semiconductor substrate. Note that, in the case where a bonding layer is provided over the surface of a supporting substrate, the bonding layer 104 does not necessarily need to be provided.

Next, in a similar manner to Embodiment Mode 4, as shown in FIG. 11C, a base layer 142, a separation layer 143, a blocking layer 144, and a bonding layer 145 are stacked in this order over a supporting substrate 141.

After this, in a similar manner to Embodiment Mode 4, as shown in FIG. 11D, the bonding layer 145 that is formed over the supporting substrate 141 and the bonding layer 104 that is formed over the semiconductor substrate 101 are located in contact with each other to bond the two together. Next, as shown in FIG. 12A, the semiconductor substrate 101 is separated from the supporting substrate 141 with the brittle regions 103a and 103b used as a separation plane, and as shown in FIG. 12A, SOI layers 105a and 105b are provided over the supporting substrate. Next, by use of the SOI layers 105a and 105b, in a similar manner to Embodiment Mode 1, as shown in FIG. 12C, field-effect transistors are formed and an element layer 151 that includes the field-effect transistors is formed. After a flexible substrate 152 is fixed to the element layer 151, as shown in FIG. 13A, a stacked-layer body that includes the flexible substrate 152 and the element layer 151 is separated from the supporting substrate 141 by a physical method. Alternatively, the stacked-layer body that includes the flexible substrate 152 and the element layer 151 is separated from the supporting substrate 141 by permeation of a liquid into the interface between the separation layer 143 and the blocking layer 144. Next, as shown in FIG. 13B, a flexible substrate 153 is attached to the blocking layer 144. Through such steps, a flexible semiconductor device can be manufactured.

After this, in the case where the element layer 151 includes a plurality of semiconductor devices, the element layer 151 and the flexible substrates 152 and 153 may be divided to cut out the plurality of semiconductor devices. Through such steps, a plurality of thin, flexible semiconductor devices can be manufactured.

In this embodiment mode, after a field-effect transistor is formed using an SOI layer that is bonded onto a supporting substrate, an element layer that includes the field-effect transistor is separated from the supporting substrate, thereby manufacturing a thin, flexible semiconductor device. Because the supporting substrate can be treated more easily than a flexible substrate, it can be easily handled during a manufacturing process and yield can be increased.

Because the SOI layers 105a and 105b formed according to this mode are semiconductor layers that have uniform crystal orientation, uniform, high-performance field-effect transistors can be obtained. In other words, it is possible to suppress inhomogeneity of values of important transistor characteristics, such as threshold voltage and mobility, and to achieve higher performance such as higher mobility. Furthermore, because the blocking layers 102a and 102b are provided between the supporting substrate 100 and the SOI layers 105a and 105b, an impurity from the supporting substrate can be prevented from entering the SOI layers. Thus, it is possible to suppress variation of characteristics among the transistors formed in the element layer.

Embodiment Mode 6

Figure 15:
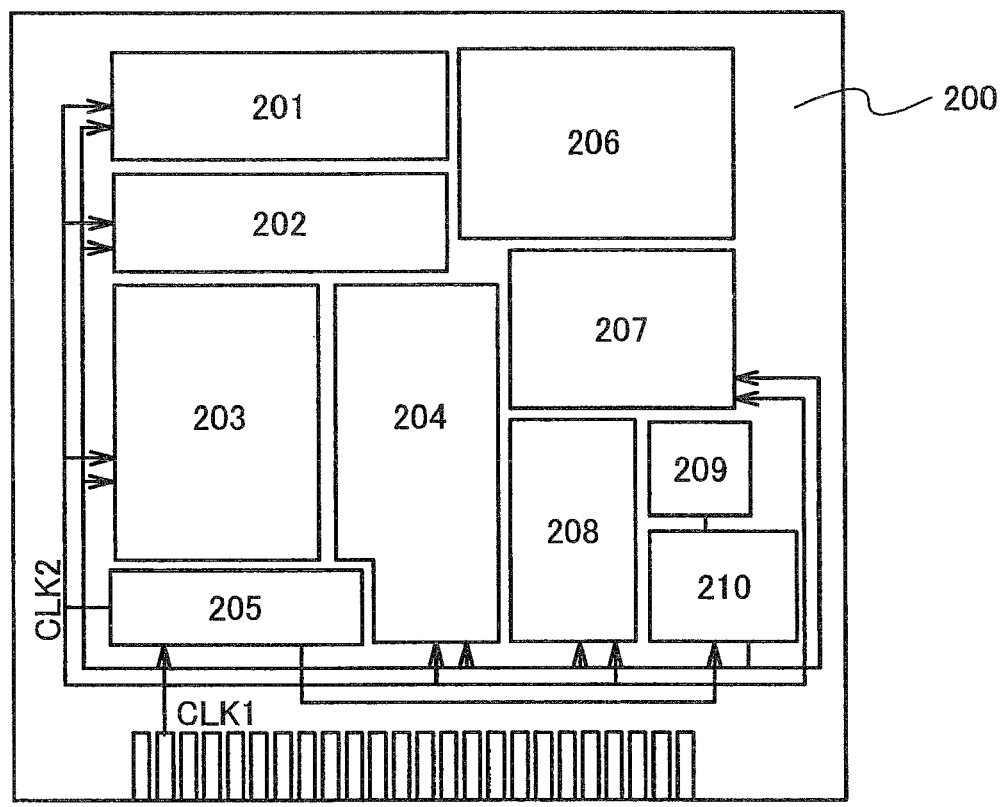
FIG. 15 is a block diagram showing a structure of a microprocessor that is one mode of a semiconductor device.

In this embodiment mode, one mode of a semiconductor device is described with reference to FIG. 15. FIG. 15 shows a structure of a microprocessor 200 obtained using an SOI substrate as an example of a semiconductor device. The microprocessor 200 is manufactured using the semiconductor substrate formed according to the present invention. This microprocessor 200 has an arithmetic logic unit (ALU) 201, an ALU controller 202, an instruction decoder 203, an interrupt controller 204, a timing controller 205, a register 206, a register controller 207, a bus interface (Bus I/F) 208, a read-only memory (ROM) 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the clock signal CLK2 to the various above-mentioned circuits. Obviously, the microprocessor 200 shown in FIG. 15 is only an example in which the configuration is simplified, and an actual microprocessor may have various configurations depending on the uses.

The above-described microprocessor 200 can achieve not only an increase in processing speed but also a reduction in power consumption because an integrated circuit is formed using a semiconductor layer (a single-crystal semiconductor layer) with uniform crystal orientation which is bonded to a supporting substrate having an insulating surface. In addition, because a blocking layer is provided between the supporting substrate and the semiconductor layer, a metal impurity such as sodium can be prevented from diffusing from the supporting substrate side and contaminating the semiconductor layer.

Embodiment Mode 7

Figure 16:
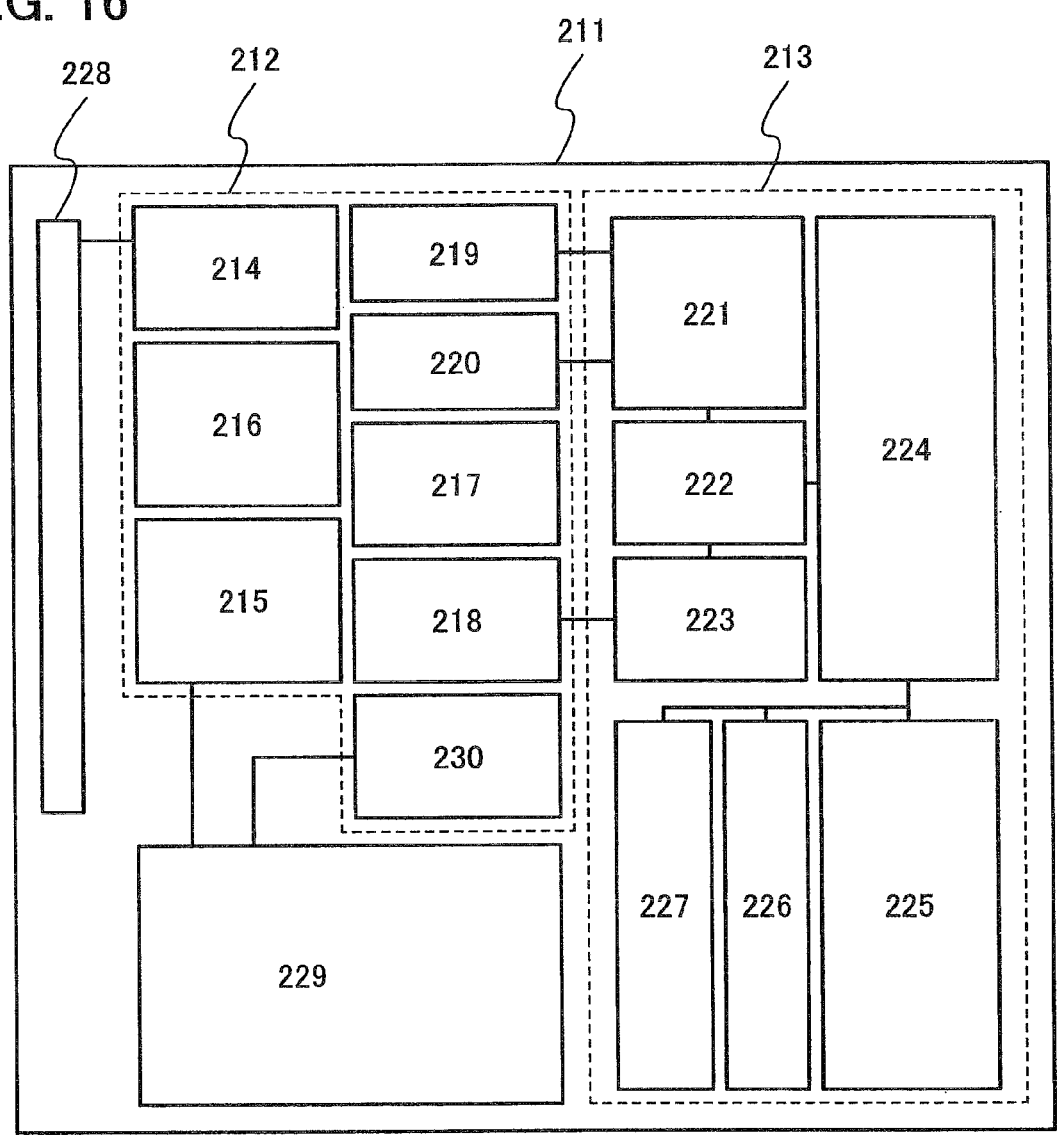
FIG. 16 is a block diagram showing a structure of an RFCPU that is one mode of a semiconductor device.

In this embodiment mode, one mode of a semiconductor device having an arithmetic function that is capable of contactless data transmission and reception is described with reference to FIG. 16. Here, a structure of an RFCPU obtained using an SOI substrate is described with reference to FIG. 16. FIG. 16 shows an example of a computer that operates to transmit and receive signals to and from an external device by wireless communication (such a computer is hereinafter referred to as an "RFCPU"). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 has an RF interface 221, a control register 222, a clock controller 223, an interface (CPU interface) 224, a central processing unit (CPU) 225, a random-access memory (RAM) 226, and a read-only memory (ROM) 227.

The operation of the RFCPU 211 having such a configuration is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 is mounted as a different component on a substrate having an insulating surface which is included in the RFCPU 211.

The reset circuit 217 generates a signal for resetting and initializing the digital circuit portion 213. For example, the reset circuit 217 generates a signal which rises after rise in the power supply voltage with delay as a reset signal. The oscillator circuit 218 changes the frequency and duty ratio of a clock signal in response to a control signal generated by the constant voltage circuit 216. The demodulator circuit 219 formed using a low-pass filter binarizes the amplitude of, for example, a received amplitude-modulated (ASK) signal. The modulator circuit 220 varies the amplitude of an amplitude-modulated (ASK) transmission signal and transmits the signal. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the interface 224. The interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit 225 using a program.

The above-described RFCPU 211 can achieve not only an increase in processing speed but also a reduction in power consumption because an integrated circuit is formed using a semiconductor layer (a single-crystal semiconductor layer) with uniform crystal orientation which is bonded to a substrate having an insulating surface or an insulating substrate. This makes it possible to ensure operation for a long period of time even when the capacitor portion 229 which supplies power is downsized. Although FIG. 16 shows the mode of RFCPU, a device such as an IC tag is also possible as long as it has a communication function, an arithmetic processing function, and a memory function.

Embodiment Mode 8

Figure 17:
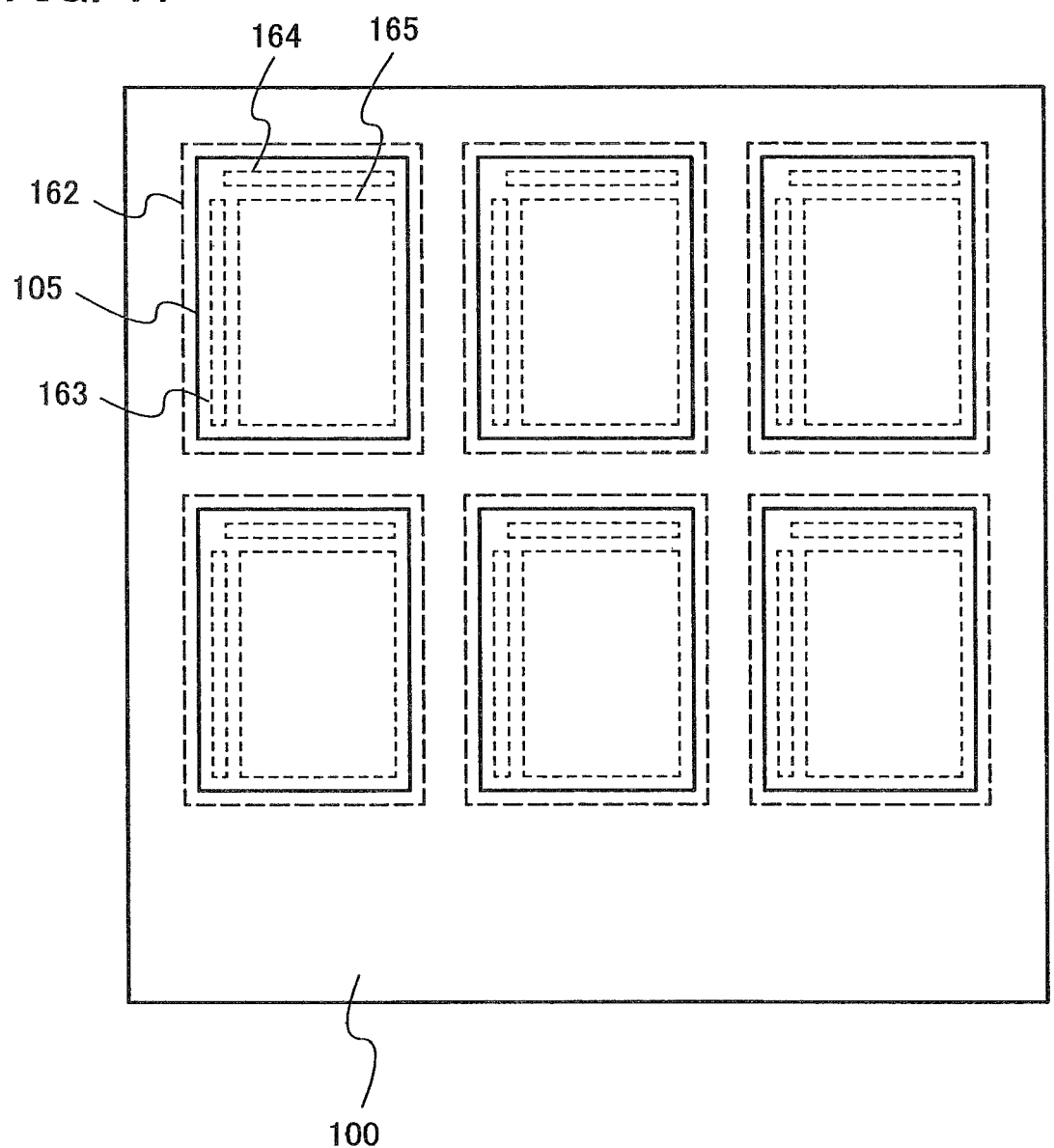
FIG. 17 is a plan view showing an example of the case of bonding a semiconductor layer to mother glass that is used for manufacturing display panels.

The SOI layer as described in any of the above embodiment modes can also be bonded to a large-sized glass substrate called mother glass used to manufacture display panels. FIG. 17 shows the case where SOI layers 105 are bonded to mother glass used as a supporting substrate 100. A plurality of display panels is taken out from mother glass, and the SOI layers 105 are preferably bonded to match formation regions of display panels 162. Since a mother glass substrate has a larger area than a semiconductor substrate, it is preferable that a plurality of SOI layers 105 be arranged within the formation regions of the display panels 162, as shown in FIG. 17. Accordingly, even if the plurality of SOI layers 105 is arranged over the supporting substrate 100, a sufficient space can be provided between adjacent SOI layers 105. Each of the display panels 162 includes a scan line driver circuit region 163, a signal line driver circuit region 164, and a pixel formation region 165. The SOI layer 105 is bonded to the supporting substrate 100 so as to include these regions.

Figure 18A:
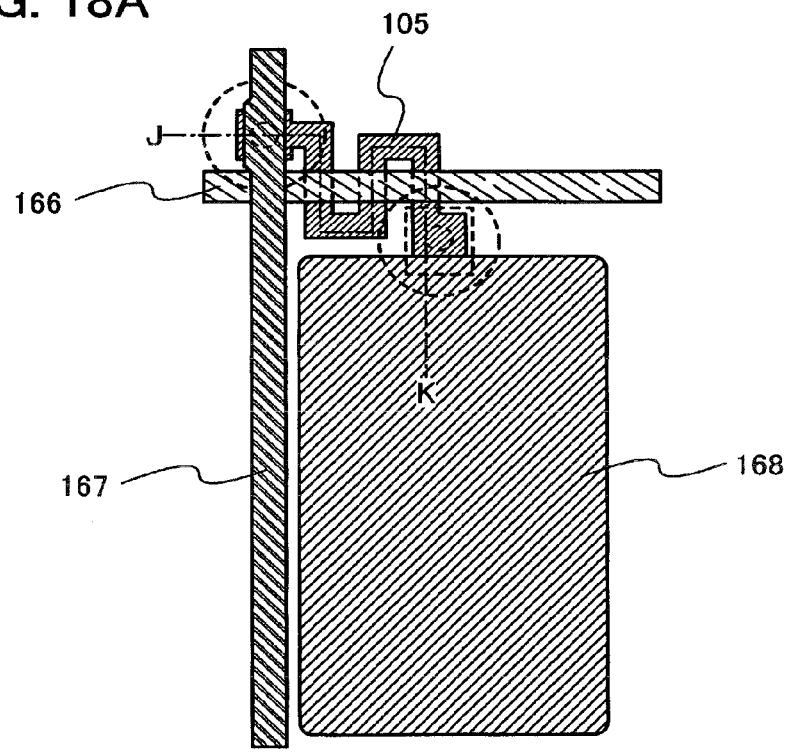
FIGS. 18A and 18B show an example of a liquid crystal display device in which a pixel transistor is formed using a semiconductor layer.
Figure 18B:
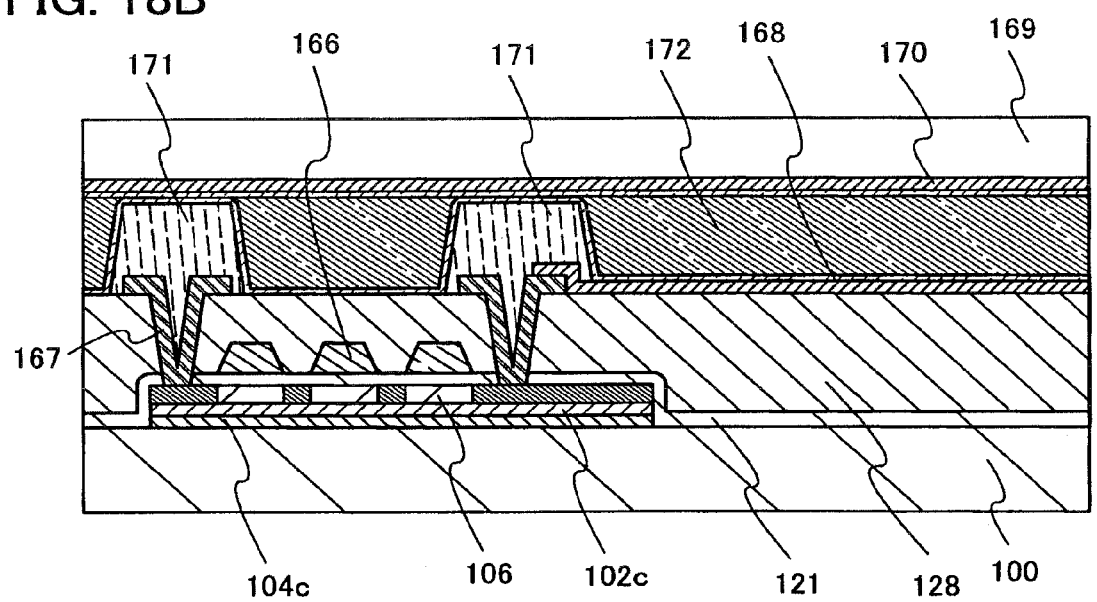

FIGS. 18A and 18B show an example of a pixel of a liquid crystal display device in which a pixel transistor is formed using a semiconductor layer that is bonded onto a large-sized glass substrate. FIG. 18A shows a plan view of a pixel, in which a scan line 166 intersects a semiconductor layer and a signal line 167 and a pixel electrode 168 are connected to the semiconductor layer. FIG. 18B shows a cross-sectional view of FIG. 11A along section line J-K.

In FIG. 18B, there is a portion that has a stacked structure of a bonding layer 104c, a blocking layer 102c, and a semiconductor layer 106 over a supporting substrate 100, and a pixel transistor is formed to include such a region. The pixel electrode 168 is provided over an interlayer insulating layer 128. By etching of the interlayer insulating layer 128, a step in the form of a depression is generated in a contact hole, in which the semiconductor layer 106 and the signal line 167 are connected to each other, and thus, a columnar spacer 171 is provided so as to fill the step. A counter substrate 169 is provided with a counter electrode 170. A liquid crystal layer 172 is formed in a space formed by the columnar spacer 171.

Figure 19A:
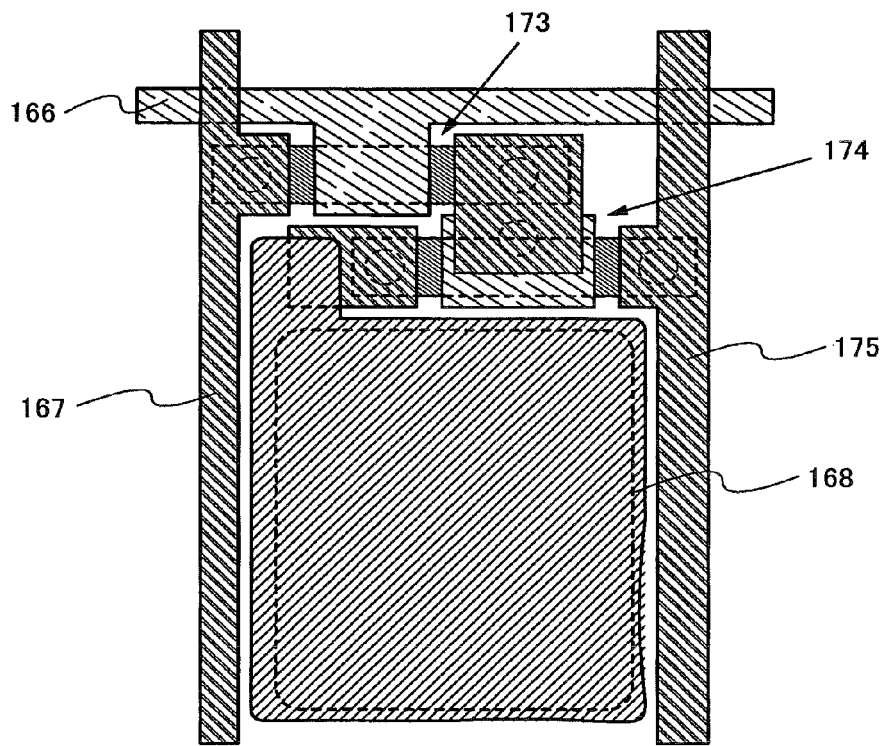
FIGS. 19A and 19B show an example of an electroluminescent display device in which a pixel transistor is formed using a semiconductor layer.
Figure 19B:
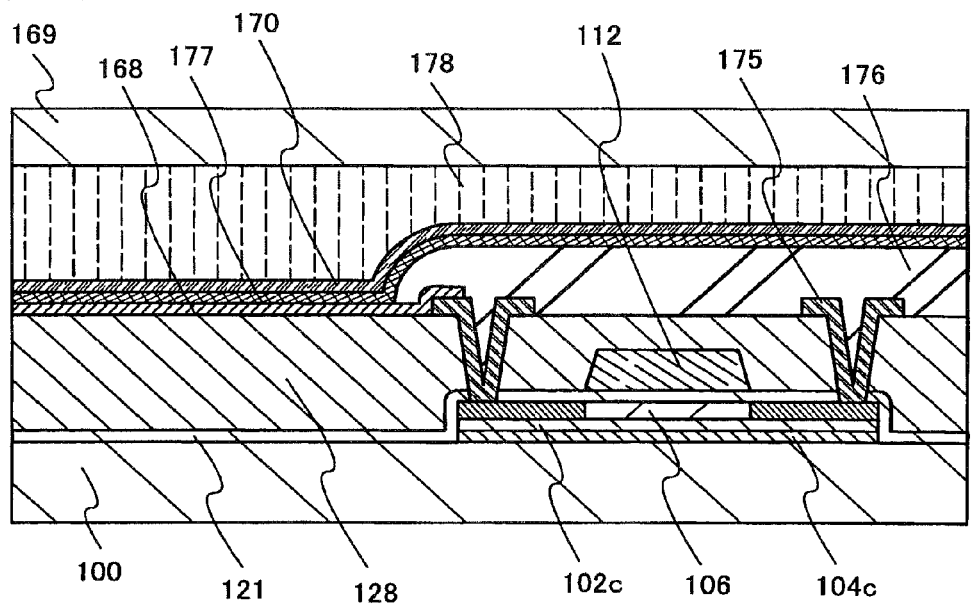

FIG. 19A shows an example of an electroluminescent display device in which a transistor of a pixel portion is formed using a semiconductor layer that is bonded onto a large-sized glass substrate. FIG. 19A shows a plan view of a pixel, which has a selection transistor 173 connected to a signal line 167 and a display control transistor 174 connected to a power supply line 175. This display device has a structure in which each pixel is provided with a light emitting element that has a layer (EL layer) formed to contain an electroluminescent material between electrodes. A pixel electrode 168 is connected to the display control transistor 174. FIG. 19B is a cross-sectional view showing a main portion of such a pixel.

In FIG. 19B, a large-sized glass substrate is used as a supporting substrate 100; there is a portion that has a structure in which a bonding layer 104c, a blocking layer 102c, and a semiconductor layer 106 are stacked over the supporting substrate; and the display control transistor is formed to include such a region. The structures of the bonding layer 104c, the blocking layer 102c, the semiconductor layer 106, an interlayer insulating layer 128, and the like are similar to those in FIG. 18B. A peripheral portion of a first electrode 168 is surrounded by an insulating partition layer 176. Over the first electrode 168, an EL layer 177 is formed. Over the EL layer 177, a second electrode 170 is formed. The pixel portion is filled with a sealing resin 178 and is provided with a substrate 169 as a reinforcing plate.

In the electroluminescent display device of this mode, such pixels are arranged in matrix to form a display screen. In this case, a channel portion of a transistor of each pixel is formed using the semiconductor layer 106 that is bonded to the supporting substrate 100. Therefore, if the semiconductor layer 106 is formed of a single-crystal semiconductor layer, there are advantages in that characteristics do not vary from transistor to transistor and emission luminescence does not vary from pixel to pixel. Therefore, drive with the brightness of a light emitting element being controlled by a current becomes easy, and a correction circuit that corrects variation of transistor characteristics becomes unnecessary. Thus, a load on a driver circuit can be reduced. Furthermore, because a light-transmitting substrate can be selected as the supporting substrate 100, a bottom-emission electroluminescent display device which emits light from the supporting substrate 100 side can be formed.

As described above, a transistor can be formed also over mother glass, which is used to manufacture display devices, by using a semiconductor layer formed using a part of a bonded semiconductor substrate. The transistor formed using the semiconductor layer is superior to an amorphous silicon transistor in all operating characteristics such as current drive capability; therefore, the transistor can be downsized. Accordingly, an aperture ratio of a pixel portion in a display panel can be increased. Furthermore, since a microprocessor like the one illustrated in FIG. 15 or 16 can be formed, a display device can be provided with a function as a computer. Moreover, a display which is capable of inputting and outputting data without contact can be manufactured.

Embodiment Mode 9

According to the present invention, a variety of electronic devices can be formed. Examples of electronic devices include a camera such as a video camera or a digital camera, a navigation system, a sound reproducing device (a car audio, an audio component, or the like), a computer, a game machine, a portable information terminal (a mobile computer, a cellular phone, a mobile game machine, an electronic book, or the like), an image reproducing device having a recording medium (specifically, a device for reproducing a recording medium such as a digital versatile disc (DVD) and having a display for displaying the reproduced image), and the like.

Figure 20A:
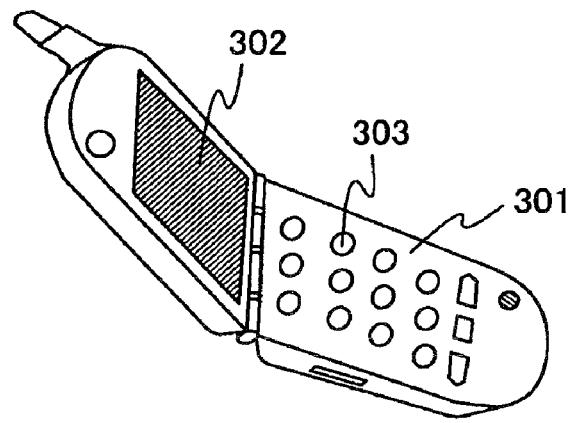
FIGS. 20A to 20C are diagrams showing examples of electronic devices in accordance with the present invention.

FIG. 20A shows an example of a cellular phone 301. This cellular phone 301 has a display portion 302, an operation portion 303, and the like. In the display portion 302, the liquid crystal display device described with reference to FIGS. 18A and 18B or the electroluminescent display device described with reference to FIGS. 19A and 19B can be used. With the use of the display device of Embodiment Mode 8, a display portion with little display unevenness and high image quality can be formed. In addition, any of the semiconductor devices described in Embodiment Modes 6 and 7 can be used for a microprocessor or a memory which is included in the cellular phone 301.

Figure 20B:
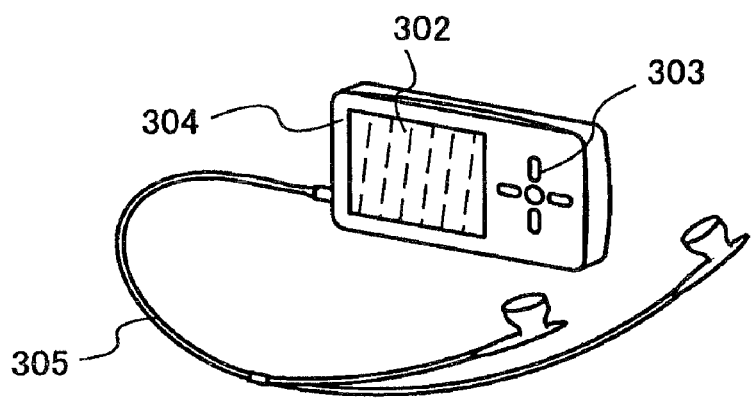

FIG. 20B shows a digital player 304, which is a typical example of an audio device. The digital player 304 shown in FIG. 20B has a display portion 302, an operation portion 303, earphones 305, and the like. Instead of the earphones 305, headphones or wireless earphones can be used. In the digital player 304, the semiconductor device of the present invention can be used for a memory portion which stores music information or a microprocessor which operates the digital player 304. The digital player 304 having this structure can achieve reductions in size and weight. By application of the liquid crystal display device described with reference to FIGS. 18A and 18B or the electroluminescent display device described with reference to FIGS. 19A and 19B to the display portion 302, the display portion 302 can display an image or textual information with high definition even if it has a screen size of about 0.3 inches to 2 inches.

Figure 20C:
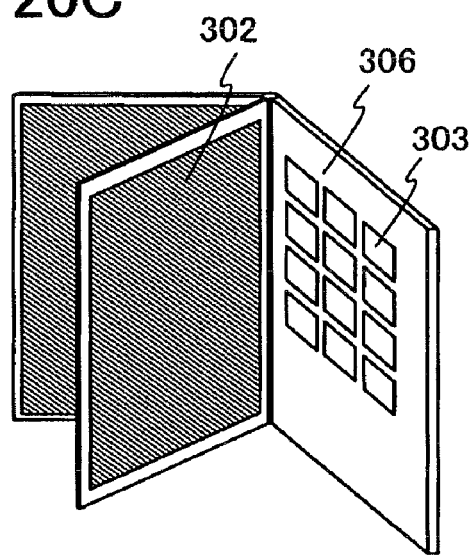

FIG. 20C shows an electronic book 306. This electronic book 306 has a display portion 302 and an operation portion 303. A modem may be built in, or a structure in which information can be transmitted and received wirelessly may be employed. In the electronic book 306, any of the semiconductor devices described in Embodiment Modes 6 and 7 can be used for a memory portion which stores information or a microprocessor which operates the electronic book 306. In the memory portion, a NOR-type nonvolatile memory with a memory capacity of 20 gigabytes (GB) to 200 gigabytes (GB) can be used, with which images or sounds (music) can be stored and reproduced. By application of the liquid crystal display device described with reference to FIGS. 18A and 18B or the electroluminescent display device described with reference to FIGS. 19A and 19B to the display portion 302, the display portion 302 can perform display with high image quality.

Embodiment Mode 10

An ion irradiation method, which is one aspect of the present invention, is considered below.

In the present invention, a single-crystal semiconductor substrate is irradiated with ions that are derived from hydrogen (H) (hereafter referred to as "hydrogen ion species"). More specifically, a hydrogen gas or a gas which contains hydrogen in its composition is used as a source material; a hydrogen plasma is generated; and a single-crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 23:
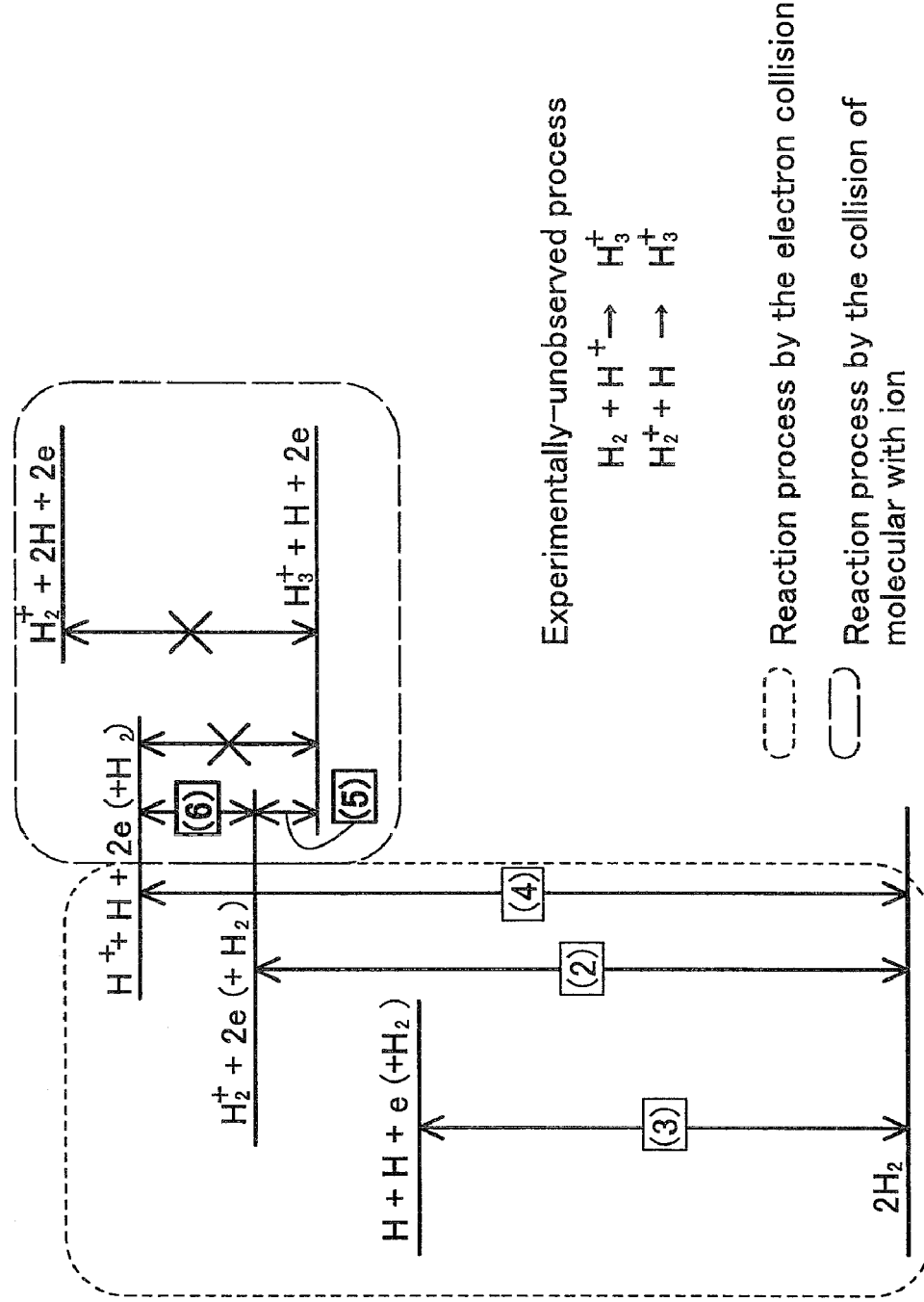
FIG. 23 is an energy diagram of hydrogen ion species.

FIG. 23 is an energy diagram which schematically shows some of the above reactions. Note that the energy diagram shown in FIG. 23 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 24:
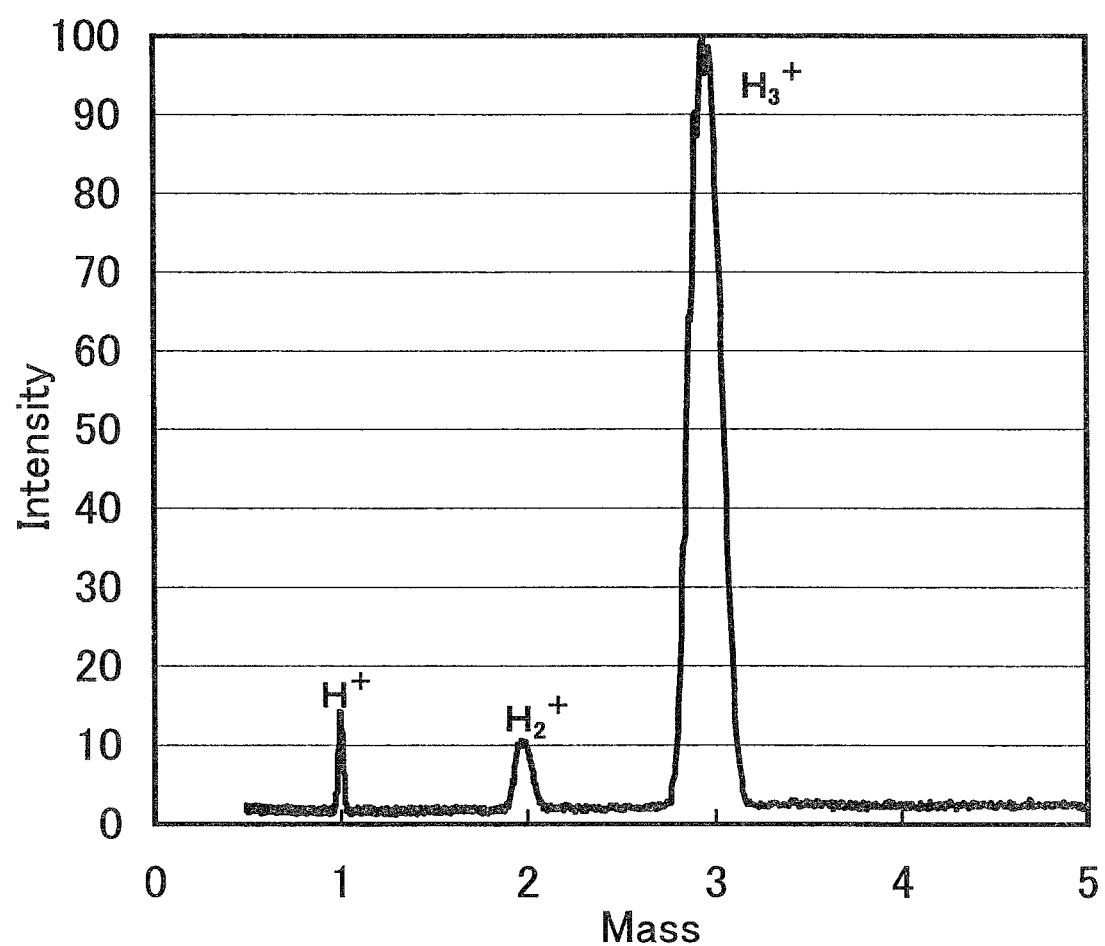
FIG. 24 is a diagram showing the results of ion mass spectrometry.

Here, an example, in which the proportions of ion species (particularly, the proportion of $H_3^+$) are different, is described. FIG. 24 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 24, the number of ions with different masses is expressed as a relative proportion where the number of ions with a mass of 3 is defined as 100. It can be seen from FIG. 24 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 25:
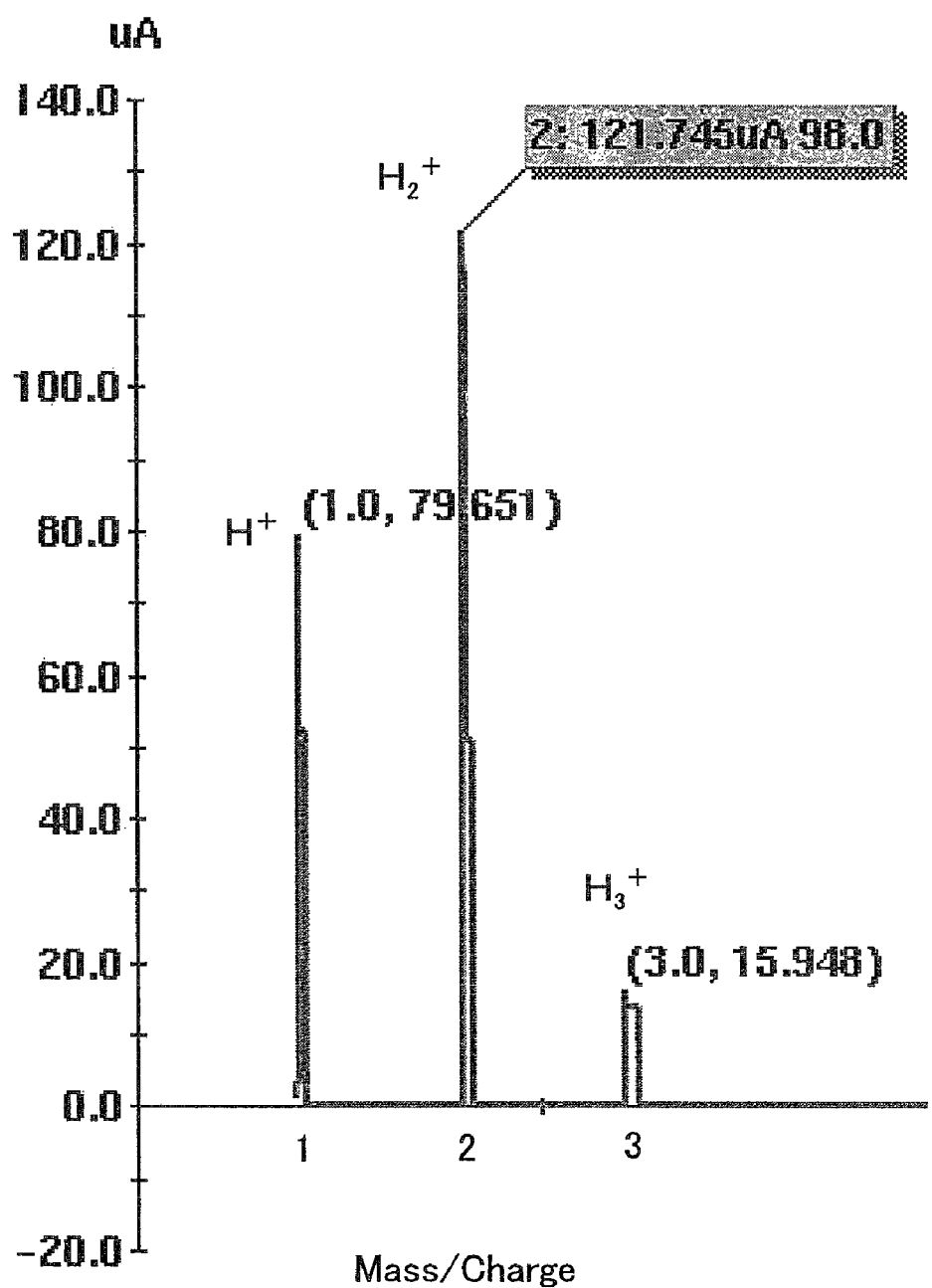
FIG. 25 is a diagram showing the results of ion mass spectrometry.

FIG. 25 is a graph showing the results of mass spectrometry of ions that are generated from $PH_3$ when an ion source different from that for the case of FIG. 24 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 24, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 25 that the ratio between ion species in a plasma, i.e., the ratio between $H^+$, $H_2^+$, and $H_3^+$, is about 37:56:7. Note that, although FIG. 25 shows the data obtained when the source gas is $PH_3$, the ratio between the hydrogen ion species is about the same when a 100% hydrogen gas is used as a source gas, as well.

In the case of the ion source from which the data shown in FIG. 25 is obtained, $H_3^+$, of $H^+$, $H_2^+$, and $H_3^+$, is generated at a proportion of only about 7%. On the other hand, in the case of the ion source from which the data shown in FIG. 24 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 24 is generated and a single-crystal semiconductor substrate is irradiated with the generated ion species without any mass separation being performed, the surface of the single-crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRI, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 26:
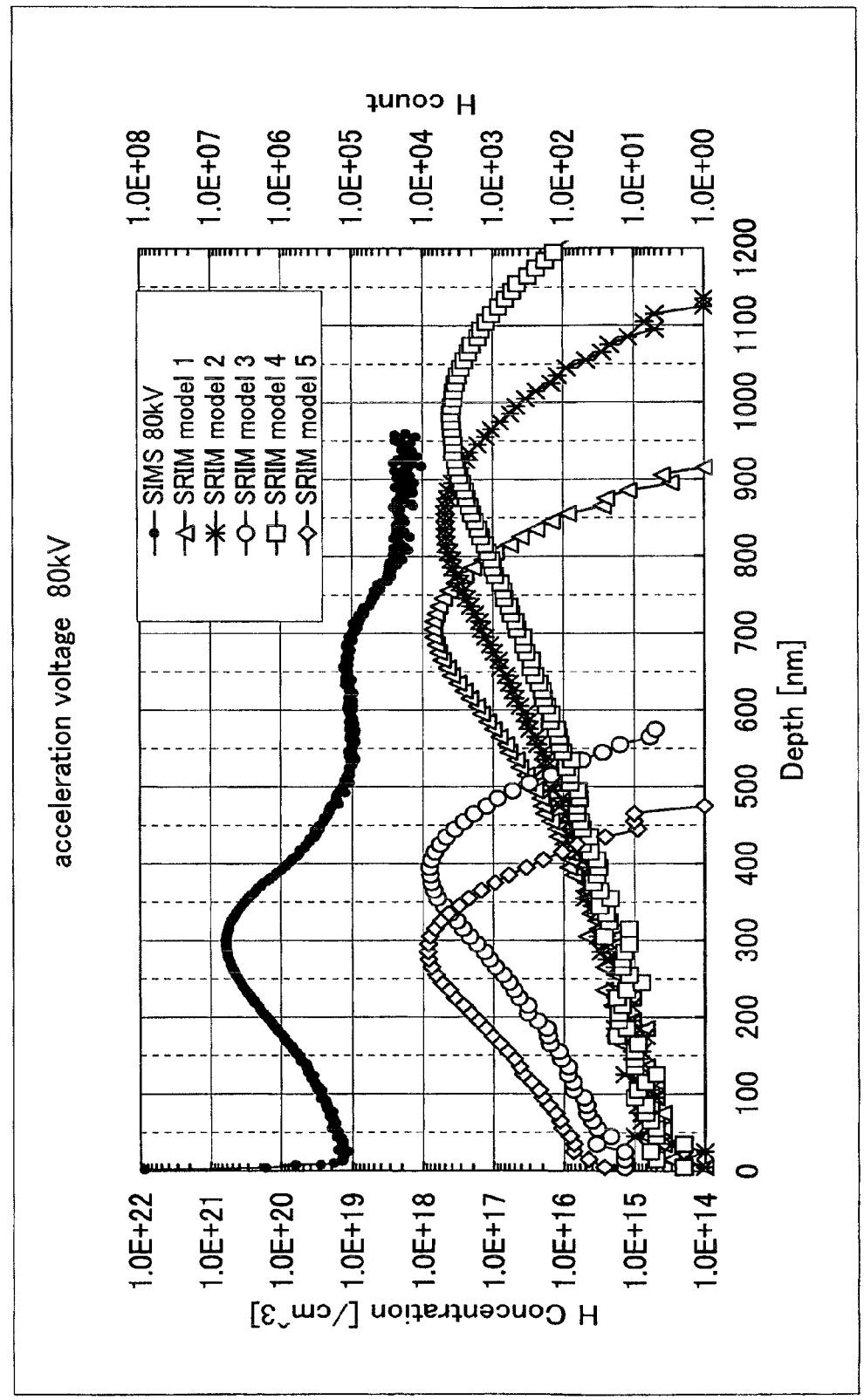
FIG. 26 is a diagram showing the profile (measured values and calculated values) of hydrogen in the depth direction when the accelerating voltage is 80 kV.

FIG. 26 shows the calculation results obtained when irradiation with the hydrogen ion species (irradiation with 100,000 atoms for H) is performed using Models 1 to 5. FIG. 26 also shows the hydrogen concentration (secondary ion mass spectrometry (SIMS) data) in an Si substrate irradiated with the hydrogen ion species of FIG. 24. The results of calculations performed using Models 1 to 5 are expressed on the vertical axis (right axis) as the number of hydrogen atoms, and the SIMS data is expressed on the vertical axis (left axis) as the concentration of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small.

Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 27:
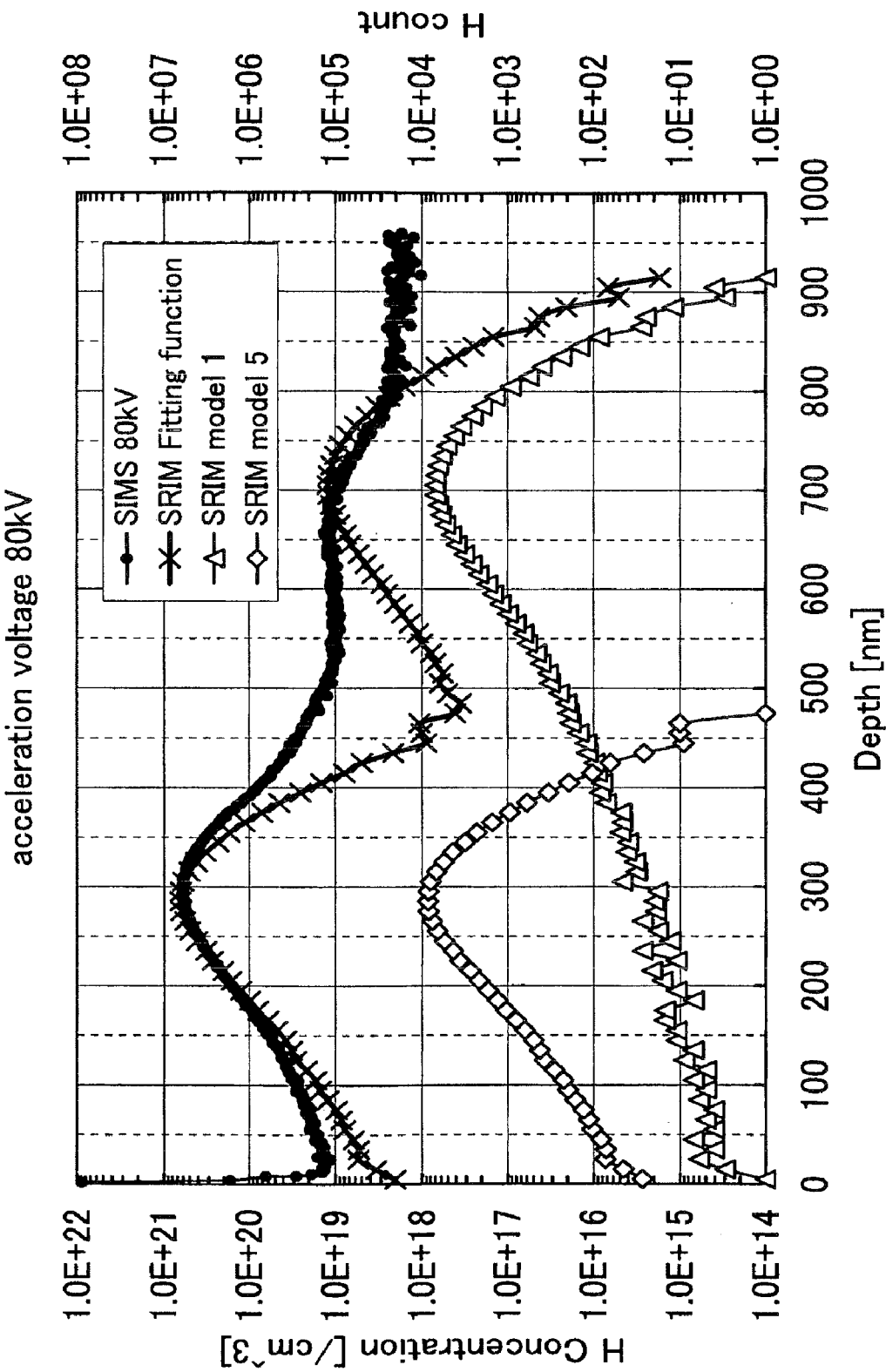
FIG. 27 is a diagram showing the profile (measured values, calculated values, and fitting functions) of hydrogen in the depth direction when the accelerating voltage is 80 kV.
Figure 28:
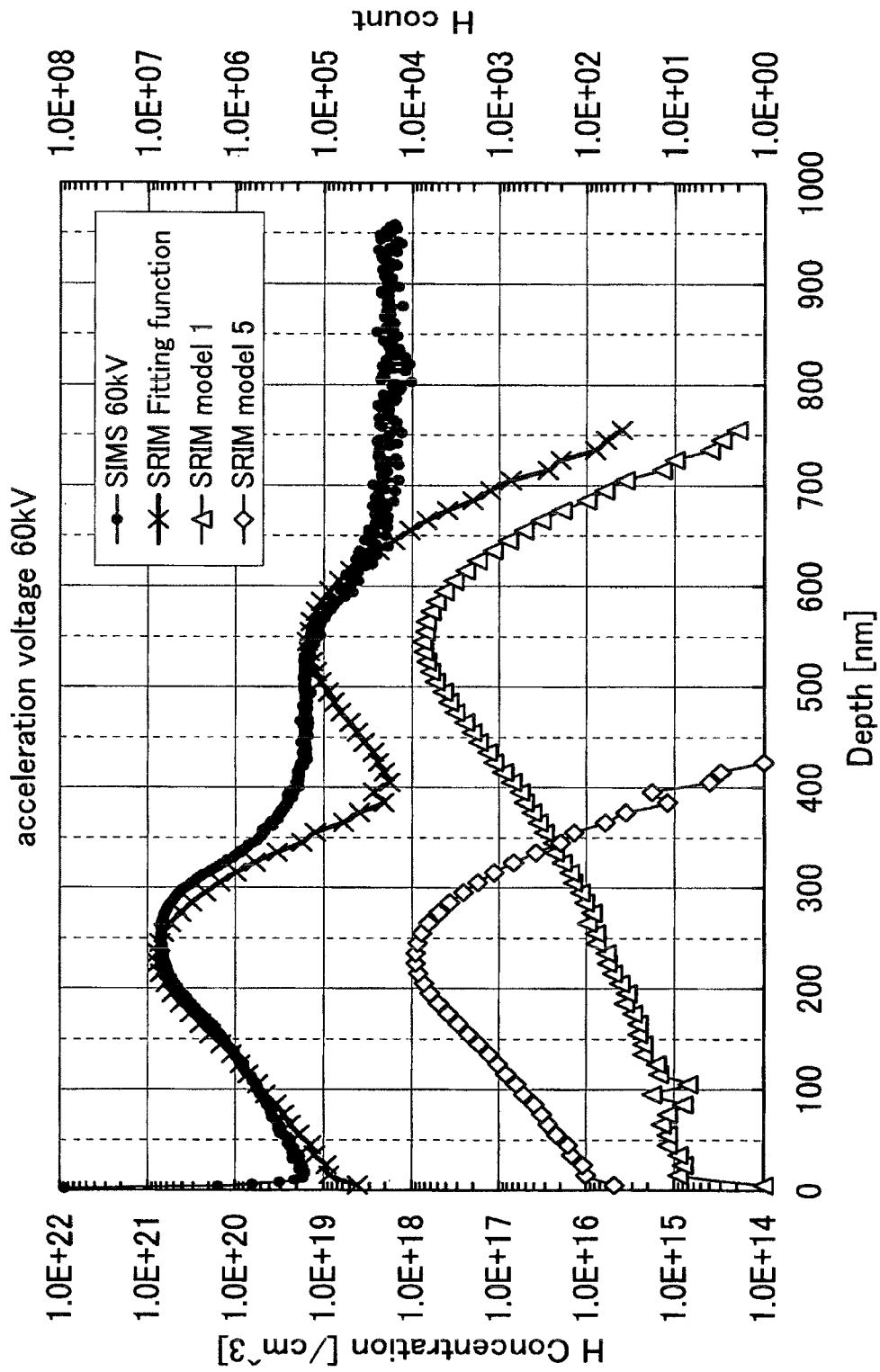
FIG. 28 is a diagram showing the profile (measured values, calculated values, and fitting functions) of hydrogen in the depth direction when the accelerating voltage is 60 kV.
Figure 29:
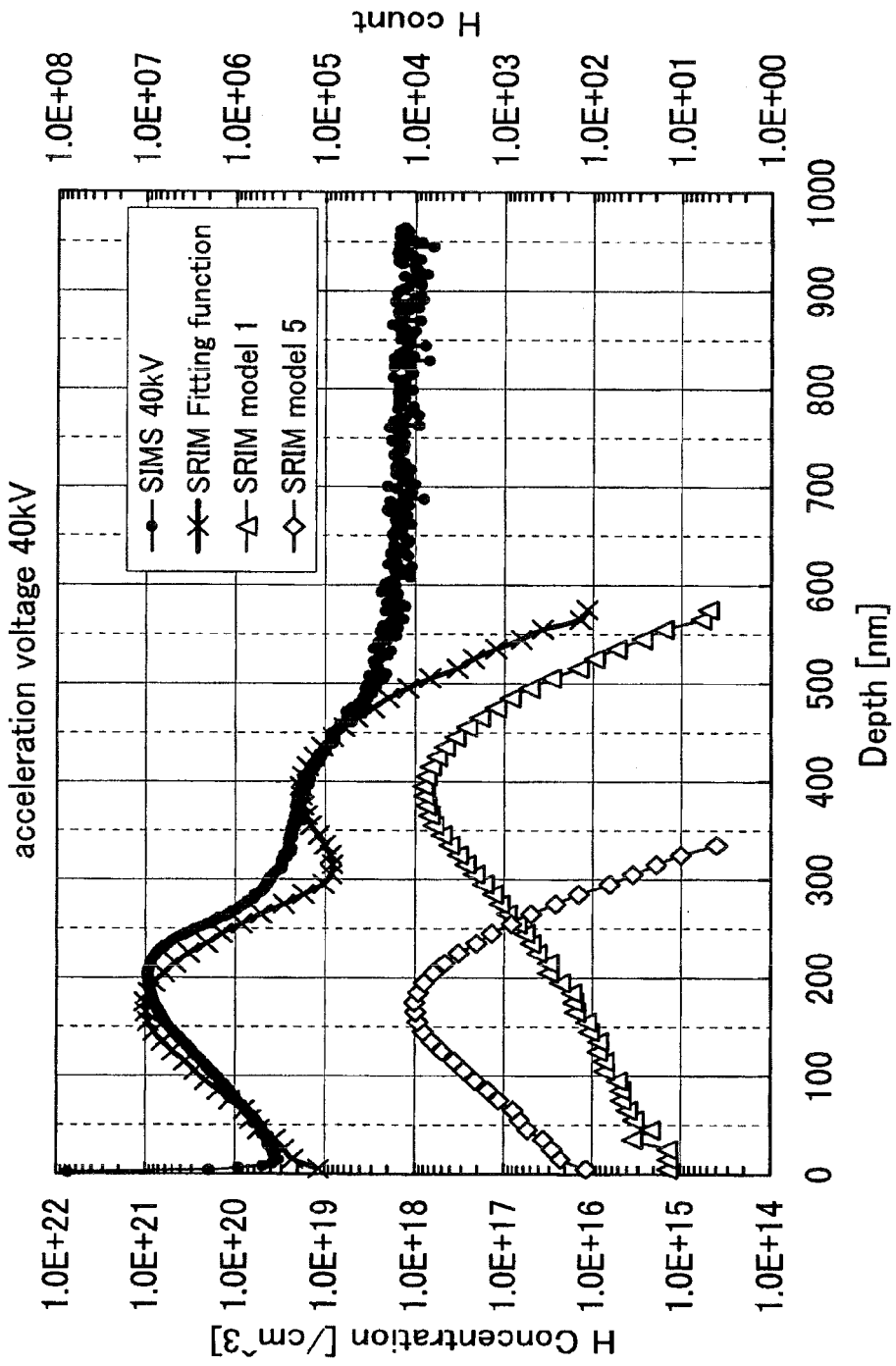
FIG. 29 is a diagram showing the profile (measured values, calculated values, and fitting functions) of hydrogen in the depth direction when the accelerating voltage is 40 kV.

Accordingly, Models 2 to 4 will not be considered hereinafter. FIGS. 27 to 29 each show the calculation results obtained when irradiation with the hydrogen ion species (irradiation with 100,000 atoms for H) is performed using Models 1 and 5. FIGS. 27 to 29 also each show the hydrogen concentration (SIMS data) in an Si substrate irradiated with the hydrogen ion species of FIG. 24, and the simulation results fitted to the SIMS data (hereinafter referred to as a fitting function). Here, FIG. 27 shows the case where the accelerating voltage is 80 kV; FIG. 28, the case where the accelerating voltage is 60 kV; and FIG. 29, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the concentration of hydrogen atoms. The horizontal axis represents depth from the surface of an Si substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+$:$H_2^+$:$H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 30 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation ($H^+$:$H_2^+$:$H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 24. For example, because $H_3^+$ splits into $H^+$, H, or the like to be introduced into a substrate, ion introduction efficiency can be improved compared with the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species as shown in FIG. 24 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion irradiation apparatus.

This application is based on Japanese Patent Application serial No. 2007-127270 filed with Japan Patent Office on May 11, 2007, the entire contents of which are hereby incorporated by reference.

What is claimed is:

1. A method for manufacturing a semiconductor device, comprising:
    forming a blocking layer over a single crystal semiconductor substrate;
    forming a groove on a surface of the single crystal semiconductor substrate by removing a part of the blocking layer and a part of the single crystal semiconductor substrate;
    irradiating the surface of the single crystal semiconductor substrate with ions to form a brittle region in the single crystal semiconductor substrate;
    forming a first bonding layer over the blocking layer;
    bonding the single crystal semiconductor substrate to a supporting substrate having an insulating surface with the first bonding layer and the insulating surface sandwiched between the single crystal semiconductor substrate and the supporting substrate; and
    separating the single crystal semiconductor substrate from the supporting substrate so that the first bonding layer, the blocking layer, and a thin layer of the single crystal semiconductor substrate which corresponds to a region between the blocking layer and the brittle region are left over the supporting substrate.

2. The method according to claim 1,
    wherein the blocking layer comprises a material selected from silicon nitride, silicon nitride oxide, aluminum nitride, and aluminum nitride oxide.

3. The method according to claim 1,
    wherein the brittle region is formed in a region which is deeper than a bottom of the groove.

4. The method according to claim 1,
    wherein a thickness of the thin layer of the single crystal semiconductor substrate is equal to or larger than 10 nm and equal to or smaller than 200 nm.

5. The method according to claim 1, further comprising a step of forming a second bonding layer over the supporting substrate,
    wherein the formation of the second bonding layer is performed before the bonding of the single crystal semiconductor substrate to the supporting substrate.

6. A method for manufacturing a semiconductor device, comprising:
    irradiating a surface of a single crystal semiconductor substrate with ions to form a brittle region in the single crystal semiconductor substrate;
    forming a groove on the surface of the single crystal semiconductor substrate by removing a part of the single crystal semiconductor substrate;
    forming a blocking layer over the single crystal semiconductor substrate;
    forming a first bonding layer over the blocking layer;
    bonding the single crystal semiconductor substrate to a supporting substrate having an insulating surface with the first bonding layer and the insulating surface sandwiched between the single crystal semiconductor substrate and the supporting substrate; and
    separating the single crystal semiconductor substrate from the supporting substrate so that the first bonding layer, the blocking layer, and a thin layer of the single crystal semiconductor substrate which corresponds to a region sandwiched between the blocking layer and the brittle region are left over the supporting substrate.

7. The method according to claim 6,
    wherein the blocking layer comprises a material selected from silicon nitride, silicon nitride oxide, aluminum nitride, and aluminum nitride oxide.

8. The method according to claim 6,
    wherein the brittle region is formed in a region which is deeper than a bottom of the groove.

9. The method according to claim 6,
    wherein a thickness of the thin layer of the single crystal semiconductor substrate is equal to or larger than 10 nm and equal to or smaller than 200 nm.

10. The method according to claim 6, further comprising a step of forming a second bonding layer over the supporting substrate,
    wherein the formation of the second bonding layer is performed before the bonding of the single crystal semiconductor substrate to the supporting substrate.

11. A method for manufacturing a semiconductor device, comprising:
    forming a blocking layer over a single crystal semiconductor substrate;
    forming a groove on a surface of the single crystal semiconductor substrate by removing a part of the blocking layer and a part of the single crystal semiconductor substrate;
    irradiating the surface of the single crystal semiconductor substrate with ions to form a brittle region in the single crystal semiconductor substrate;
    forming a first bonding layer over a supporting substrate having an insulating surface;
    bonding the single crystal semiconductor substrate to the supporting substrate with the first bonding layer and the insulating surface sandwiched between the single crystal semiconductor substrate and the supporting substrate; and
    separating the single crystal semiconductor substrate from the supporting substrate so that the first bonding layer, the blocking layer, and a thin layer of the single crystal semiconductor substrate which corresponds to a region sandwiched between the blocking layer and the brittle region are left over the supporting substrate.

12. The method according to claim 11,
    wherein the blocking layer comprises a material selected from silicon nitride, silicon nitride oxide, aluminum nitride, and aluminum nitride oxide.

13. The method according to claim 11,
    wherein the brittle region is formed in a region which is deeper than a bottom of the groove.

14. The method according to claim 11,
wherein a thickness of the thin layer of the single crystal semiconductor substrate is equal to or larger than 10 nm and equal to or smaller than 200 nm.

15. The method according to claim 11, further comprising a step of forming a second bonding layer over the blocking layer,
wherein the formation of the second bonding layer is performed before the bonding of the single crystal semiconductor substrate to the supporting substrate.

16. A method for manufacturing a semiconductor device, comprising:
irradiating a surface of a single crystal semiconductor substrate with ions to form a brittle region in the single crystal semiconductor substrate;
forming a groove on the surface of the single crystal semiconductor substrate by removing a part of the single crystal semiconductor substrate;
forming a blocking layer over the single crystal semiconductor substrate;
forming a first bonding layer over a supporting substrate having an insulating surface;
bonding the single crystal semiconductor substrate to the supporting substrate with the blocking layer and the first bonding layer sandwiched between the single crystal semiconductor substrate and the supporting substrate; and
separating the single crystal semiconductor substrate from the supporting substrate so that the first bonding layer, the blocking layer, and a thin layer of the single crystal semiconductor substrate which corresponds to a region sandwiched between the blocking layer and the brittle region are left over the supporting substrate.

17. The method according to claim 16,
wherein the blocking layer comprises a material selected from silicon nitride, silicon nitride oxide, aluminum nitride, and aluminum nitride oxide.

18. The method according to claim 16,
wherein the brittle region is formed in a region which is deeper than a bottom of the groove.

19. The method according to claim 16,
wherein a thickness of the thin layer of the single crystal semiconductor substrate is equal to or larger than 10 nm and equal to or smaller than 200 nm.

20. The method according to claim 16, further comprising a step of forming a second bonding layer over the blocking layer,
wherein the formation of the second bonding layer is performed before the bonding of the single crystal semiconductor substrate to the supporting substrate.

* * * * *